United States Patent
Chouaib et al.

(10) Patent No.: US 11,036,898 B2
(45) Date of Patent: Jun. 15, 2021

(54) MEASUREMENT MODELS OF NANOWIRE SEMICONDUCTOR STRUCTURES BASED ON RE-USEABLE SUB-STRUCTURES

(71) Applicant: KLA-Tencor Corporation, Milpitas, CA (US)

(72) Inventors: Houssam Chouaib, Milpitas, CA (US); Alexander Kuznetsov, Austin, TX (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/352,776

(22) Filed: Mar. 13, 2019

(65) Prior Publication Data

US 2019/0286787 A1    Sep. 19, 2019

Related U.S. Application Data

(60) Provisional application No. 62/643,322, filed on Mar. 15, 2018.

(51) Int. Cl.
  *G01R 31/308*    (2006.01)
  *G06F 30/17*    (2020.01)
  *G01R 31/309*    (2006.01)

(52) U.S. Cl.
  CPC .......... *G06F 30/17* (2020.01); *G01R 31/309* (2013.01)

(58) Field of Classification Search
  CPC .. G01N 21/55; G01N 21/1717; G01N 21/211; G01N 21/956; G01N 21/8422; G01N 21/4788; G01N 21/9501; G01N 21/9515; G01B 11/24; G01B 11/30; G01B 11/303; G01B 11/0625; G01B 11/0633;
  (Continued)

(56) References Cited

U.S. PATENT DOCUMENTS 5,608,526 A    3/1997    Piwonka-Corle et al.
5,859,424 A    1/1999    Norton et al.
(Continued)

OTHER PUBLICATIONS

Khodykin et al., U.S. Appl. No. 15/867,633, filed Jan. 10, 2018.
(Continued)

*Primary Examiner* — Minh N Tang
(74) *Attorney, Agent, or Firm* — Spano Law Group; Joseph S. Spano

(57) ABSTRACT

Methods and systems for generating measurement models of nanowire based semiconductor structures based on re-useable, parametric models are presented herein. Metrology systems employing these models are configured to measure structural and material characteristics (e.g., material composition, dimensional characteristics of structures and films, etc.) associated with nanowire semiconductor fabrication processes. The re-useable, parametric models of nanowire based semiconductor structures enable measurement model generation that is substantially simpler, less error prone, and more accurate. As a result, time to useful measurement results is significantly reduced, particularly when modelling complex, nanowire based structures. The re-useable, parametric models of nanowire based semiconductor structures are useful for generating measurement models for both optical metrology and x-ray metrology, including soft x-ray metrology and hard x-ray metrology.

20 Claims, 18 Drawing Sheets

(58) Field of Classification Search
CPC ..... G01B 11/0641; H01L 22/12; H01L 22/30; G01R 31/309; G01R 31/311; G06F 7/70616; G06F 7/70625; G06F 17/5086

See application file for complete search history.

(56) References Cited

U.S. PATENT DOCUMENTS

| | | | |
|---|---|---|---|
| 6,429,943 | B1 | 8/2002 | Opsal et al. |
| 6,633,831 | B2 | 10/2003 | Nikoonahad et al. |
| 6,734,967 | B1 | 5/2004 | Piwonka-Corle et al. |
| 6,816,570 | B2 | 10/2004 | Janik et al. |
| 6,895,075 | B2 | 5/2005 | Yokhin et al. |
| 6,972,852 | B2 | 12/2005 | Opsal et al. |
| 7,478,019 | B2 | 1/2009 | Zangooie et al. |
| 7,755,764 | B2 | 7/2010 | Kwak et al. |
| 7,826,071 | B2 | 11/2010 | Shchegrov et al. |
| 7,907,264 | B1 | 3/2011 | Krishnan |
| 7,929,667 | B1 | 4/2011 | Zhuang et al. |
| 7,933,026 | B2 | 4/2011 | Opsal et al. |
| 8,749,179 | B2 | 6/2014 | Liu et al. |
| 8,860,937 | B1 | 10/2014 | Dziura et al. |
| 8,879,073 | B2 | 11/2014 | Madsen et al. |
| 8,941,336 | B1 | 1/2015 | Liu et al. |
| 9,915,522 | B1 | 3/2018 | Jiang et al. |
| 10,458,912 | B2 * | 10/2019 | Chouaib ............... G01B 11/303 |
| 2007/0081169 | A1 | 4/2007 | Diebold et al. |
| 2008/0170242 | A1 | 7/2008 | Chard et al. |
| 2013/0114085 | A1 | 5/2013 | Wang et al. |
| 2014/0111791 | A1 | 4/2014 | Manassen et al. |
| 2014/0172394 | A1 | 6/2014 | Kuznetsov et al. |
| 2014/0222380 | A1 | 8/2014 | Kuznetsov et al. |
| 2014/0297211 | A1 | 10/2014 | Pandev et al. |
| 2014/0316730 | A1 | 10/2014 | Shchegrov et al. |
| 2015/0042984 | A1 | 2/2015 | Pandev et al. |
| 2015/0046118 | A1 | 2/2015 | Pandev et al. |
| 2015/0051877 | A1 | 2/2015 | Bakeman et al. |
| 2015/0110249 | A1 | 4/2015 | Bakeman et al. |
| 2015/0199463 | A1 | 7/2015 | Iloreta et al. |
| 2018/0059019 | A1 | 3/2018 | Houssam et al. |
| 2019/0017946 | A1 | 1/2019 | Wack et al. |

OTHER PUBLICATIONS

International Search Report dated Jul. 3, 2019, for PCT Application No. PCT/US2019/022370 filed on Mar. 14, 2019 by KLA-Tencor Corporation, 3 pages.

Curt A. Richter et al., "Metrology for the Electrical Characterization of Semiconductor Nanowires," IEEE Transactions on Electron Devices, Nov. 7, 2008, vol. 55: pp. 3086-3095 and 10.1109/TED.2008.2005394.

* cited by examiner

US 11,036,898 B2

MEASUREMENT MODELS OF NANOWIRE SEMICONDUCTOR STRUCTURES BASED ON RE-USEABLE SUB-STRUCTURES

CROSS REFERENCE TO RELATED APPLICATION

The present application for patent claims priority under 35 U.S.C. § 119 from U.S. provisional patent application Ser. No. 62/643,322, entitled "Methods And Tools For Generating Semiconductor Device Models With Nanowire Sub Structures," filed Mar. 15, 2018, the subject matter of which is incorporated herein by reference in its entirety.

TECHNICAL FIELD

The described embodiments relate to metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical and x-ray based metrology techniques offer the potential for high throughput without the risk of sample destruction. A number of techniques including scatterometry and reflectometry implementations and associated analysis algorithms are commonly used to characterize critical dimensions, film thicknesses, composition and other parameters of nanoscale structures.

As devices (e.g., logic and memory devices) move toward smaller nanometer-scale dimensions, characterization becomes more difficult. Devices incorporating complex three-dimensional geometry and materials with diverse physical properties contribute to characterization difficulty. Device shapes and profiles are changing dramatically. In one example, recently conceived nanowire based semiconductor devices incorporate new complex three-dimensional geometry and materials with diverse orientation and physical properties. Nanowire devices are particularly difficult to characterize, particularly with optical metrology.

In response to these challenges, more complex metrology tools have been developed. Measurements are performed over large ranges of several machine parameters (e.g., wavelength, azimuth and angle of incidence, etc.), and often simultaneously. As a result, the measurement time, computation time, and the overall time to generate reliable results, including measurement recipes and accurate measurement models, increases significantly.

Existing model based metrology methods typically include a series of steps to model and then measure structure parameters. Typically, measurement data (e.g., DOE spectra) is collected from a set of samples or wafers, a particular metrology target, a testing critical dimension target, an in-cell actual device target, an SRAM memory target, etc. An accurate model of the optical response from these complex structures includes a model of the geometric features, dispersion parameter, and the measurement system is formulated. Typically, a regression is performed to refine the geometric model. In addition, simulation approximations (e.g., slabbing, Rigorous Coupled Wave Analysis (RCWA), etc.) are performed to avoid introducing excessively large errors. Discretization and RCWA parameters are defined. A series of simulations, analysis, and regressions are performed to refine the geometric model and determine which model parameters to float. A library of synthetic spectra is generated. Finally, measurements are performed using the library or regression in real time with the geometric model.

Currently, models of device structures being measured are assembled from primitive structural building blocks by a user of a measurement modeling tool. These primitive structural building blocks are simple geometric shapes (e.g., square frusta) that are assembled together to approximate more complex structures. The primitive structural building blocks are sized by the user and sometimes customized based on user input to specify the shape details of each primitive structural building block. In one example, each primitive structural building block includes an integrated customization control panel where users input specific parameters that determine the shape details to match an actual, physical structure being modeled. Similarly, primitive structural building blocks are joined together by constraints that are also manually entered by the user. For example, the user enters a constraint that ties a vertex of one primitive building block to a vertex of another building block. This allows the user to build models that represent a series of the actual device geometries when the size of one building block changes. User-defined constraints between primitive structural building blocks enable broad modeling flexibility. For example, the thicknesses or heights of different primitive structural building blocks can be constrained to a single parameter in multi-target measurement applications. Furthermore, primitive structural building blocks have simple geometric parameterizations which the user can constrain to application-specific parameters. For example, the sidewall angle of a resist line can be manually constrained to parameters representing the focus and dose of a lithography process.

Although models constructed from primitive structural building blocks offer a wide range of modeling flexibility and user control, the model building process becomes very complex and error prone when modeling nanowire based semiconductor structures. A user needs to assemble primitive structural building blocks together accurately, ensure they are correctly constrained, and parameterize the model in a geometrically consistent manner. Accomplishing this is not an easy task, and users spend significant amounts of time ensuring that their models are correct. In many cases, users do not realize their models are inconsistent and incorrect because it is difficult to comprehend how all of the primitive structural building blocks change shape and location in parameter space. Specifically, it is very difficult to determine if models that are structurally consistent for a given set of parameter values remain structurally consistent for another set of parameter values.

FIG. 1A depicts twelve different primitive structural building blocks 11-22 assembled together to form an optical critical dimension (OCD) model 10 depicted in FIG. 1B. Each primitive structural building block is rectangular in shape. To construct OCD model 10 a user must manually define the desired dimensions, constraints, and independent parameters (e.g., parameters subject to variation) of the model. Models constructed based on primitive structural building blocks (i.e., basic shapes such as rectangles) typically require a large number of primitives, constraints, and independent parameters for which the user must define ranges of variation. This makes model-building very complex and prone to user errors.

Furthermore, model complexity makes it difficult for one user to understand models built by another. The user needs to be able to understand the intent of the original model owner and this becomes increasingly challenging as the number of primitive structural building blocks, constraints, and independent parameters increases. Consequently, transferring ownership of models (e.g., from applications engineers to process engineers) is a time consuming, difficult process. In many cases, the complexity of the models leads to frustration amongst colleagues, and in some cases, prevents the transfer process from ever being fully completed. In some examples, a user generates a new model from primitive structural building blocks to mimic a model generated by a colleague. In many cases the resulting model is slightly different, and therefore delivers slightly different results due to the non-commutative property of floating point operations on computers. In some other examples, a user surrenders or risks intellectual property by having another firm develop the model.

Existing primitive structural building blocks were designed to model planar complementary metal oxide semiconductor (CMOS) structures and vertical FinFET structures. For these applications, the current primitive structural building blocks offer a wide range of modeling flexibility and provide a fair approximation of actual geometry with good measurement accuracy. Physical gaps in these traditional structures were limited, and existing primitive structural building blocks have been effective.

Unfortunately, existing primitive structural building blocks are inadequate for modeling of nanowire based semiconductor structures fabricated using nanowire fabrication processes. The model building process with existing primitive structural building blocks is very complex and error prone. The topography of nanowire based semiconductor structures is different from existing planar structures or vertical structures. Existing primitive structural building blocks are not sufficiently flexible to accurately represent the shapes encountered with the nanowire fabrication process. As a result, model accuracy suffers. Even if a user accurately assembles several primitive structural building blocks together, sets the correct constraints without error, and reparametrizes the model in a consistent way, the resulting model is not accurate enough to represent real nanowire based semiconductor structures. In addition, building an approximate model of a nanowire based semiconductor structure with currently available structural building blocks is an error prone task. Users spend significant amounts of time ensuring that their models are implemented as planned and designed. In many cases the complex assemblies of available structural building blocks result in inconsistent and incorrect models. In many cases, models of nanowire semiconductor structures cannot be accurately modelled using existing structural building blocks. Furthermore, some layers cannot be modelled using existing structural building blocks at all.

In summary, modelling of nanowire based semiconductor structures with existing structural building blocks requires the specification of a large number of structural primitives, constraints, and independent parameters. Users spend a significant amount of time building an approximate structure. The process is error prone and not flexible. Users manually define the desired dimensions, set the constraints, and specify values of the independent parameters. In spite of this effort, in many examples, the resulting models are not capable of modelling the nanowire based fabrication process with any useful accuracy.

Until recently, metrology structures remained simple enough that new models were commonly designed for each project. However, modeling of emerging nanowire based semiconductor structures has resulted in increasingly complicated models with unsatisfactory results. As nanowire based semiconductor structures become more common, and with less time per project, improved modeling methods and tools are desired.

SUMMARY

Methods and systems for generating measurement models of nanowire based semiconductor structures based on re-useable, parametric models are presented herein. Metrology systems employing these models are configured to measure structural and material characteristics (e.g., material composition, dimensional characteristics of structures and films, etc.) associated with nanowire semiconductor fabrication processes. The re-useable, parametric models of nanowire based semiconductor structures enable measurement model generation that is substantially simpler, less error prone, and more accurate. As a result, time to useful measurement results is significantly reduced, particularly when modelling complex, nanowire based structures. The re-useable, parametric models of nanowire based semiconductor structures are useful for generating measurement models for both optical metrology and x-ray metrology, e.g., soft x-ray metrology and hard x-ray metrology.

In one aspect, a model building tool includes re-useable, parametric models of complex device sub-structures useable as building blocks in a model of a complex nanowire based semiconductor device. This makes the model building process more intuitive and less error-prone. Furthermore, because the re-useable, parametric sub-structure models are optimized for nanowire based semiconductor structures and measurement applications, the resulting discretized measurement model is computationally more efficient than traditional models. In addition, the parametric sub-structure models can be saved and shared among different projects and different users.

A re-useable, parametric sub-structure model is fully defined by the values of the independent parameters entered by the user of the model building tool. All other variables associated with the model shape and internal constraints among constituent geometric elements are pre-defined within the model. Thus, beyond the values of the independent parameters, no other user input is required to fully define the re-useable, parametric sub-structure model. This greatly simplifies the model building process.

In a further aspect, a new set of parametric sub-structure models (i.e., primitive nanowire building blocks) are described. These primitive nanowire building blocks are employed to accurately model the geometry of next generation semiconductor devices based on nanowire fabrication processes. Each primitive nanowire building block is fully defined by the values of the independent parameters entered by the user. No other user input is required to define the shape of the primitive nanowire building block. This significantly simplifies the model building process associated with nanowire based semiconductor structures. This leads to much faster modeling of complex, nanowire based, semiconductor devices with fewer errors.

Several different primitive nanowire building blocks are presented herein including, a cylindrically shaped primitive nanowire building block, a square shaped primitive nanowire building block, a rectangular or slab shaped primitive nanowire building block, a hexagonal shaped primitive nanowire building block, a square shaped nanowire building block having rounded edges, an elliptically shaped primitive nanowire building block a step shaped primitive nanowire building block having two different cross-sections, and an elongated nanowire building block having two different cross-sections. In general, each nanowire building block may be oriented laterally or vertically.

In some embodiments, a model building tool generates a re-useable, parametric sub-structure model (e.g., a composite nanowire building block) based on a composition of a number of primitive nanowire building blocks, or simpler re-useable, parametric sub-structure models (e.g., composite nanowire building blocks) indicated by a user. The composition changes the collection of individual models into a single re-useable, parametric sub-structure model that can be used as an element of a measurement model as if it is a primitive building block. The model building tool saves the sub-structure model for later use. Internally, the sub-structure model includes the constraints necessary to fully integrate all of the underlying geometric primitives. These constraints are saved as part of the sub-structure model and are enforced at every instance of the sub-structure model. In this manner, users can create a collection of commonly used complex shapes with pre-defined constraints. The sub-structure model can be unloaded and saved into files, reloaded into a project and used, and shared among users.

Several different composite nanowire building blocks are presented herein including a uniform thickness wrapper, a non-uniform thickness wrapper, a uniform, conformal liner-wrapper, a non-uniform, conformal liner-wrapper, a conformal spacer-wrapper, and an inner spacer.

In another further aspect, a model building tool integrates one or more re-useable, parametric models into a measurement model of a complex nanowire based semiconductor device. In some embodiments, a model building tool receives input from a user to combine geometric primitives with a re-useable, parametric sub-structure model to form a measurement model. In some other embodiments, a measurement model of a semiconductor device is fully described by one re-useable, parametric model. In some other embodiments, a measurement model of a semiconductor device is fully described by a combination of two or more re-useable, parametric models.

The re-useable, parametric sub-structure models generated by the model building tool enable a user or group of users to generate a library of sub-structures that can be reused. Different users who use different instances of the same sub-structure model can expect to achieve the same numerical results.

In another further aspect, the model building tool generates and makes available for use, re-useable, parametric models of complex device sub-structures that include key characteristics of specific semiconductor processes embedded into their design.

In another further aspect, the model building tool generates and makes available for use, re-useable, parametric models of complex device sub-structures that include measurement application specific details (e.g., constraints, dimensions, etc. that derive from particular applications).

In yet another aspect, the model building tool includes security features to control the sharing of sensitive intellectual property with particular users.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Scatterometry based metrology for critical dimensions (CDs), thin film thicknesses, optical properties and compositions, overlay, lithography focus/dose, etc., typically requires a geometric model of the underlying structure to be measured. This measurement model includes the physical dimensions, material properties, and parameterization of the structure.

Methods and systems for generating measurement models of nanowire based semiconductor structures based on re-useable, parametric models are presented herein. Metrology systems employing these models are configured to measure structural and material characteristics (e.g., material composition, dimensional characteristics of structures and films, etc.) associated with nanowire semiconductor fabrication processes. The re-useable, parametric models of nanowire based semiconductor structures enable measurement model generation that is substantially simpler, less error prone, and more accurate. As a result, time to useful measurement results is significantly reduced, particularly when modelling complex, nanowire based structures. The re-useable, parametric models of nanowire based semiconductor structures are useful for generating measurement models for both optical metrology and x-ray metrology, e.g., soft x-ray metrology and hard x-ray metrology.

Figure 1A:
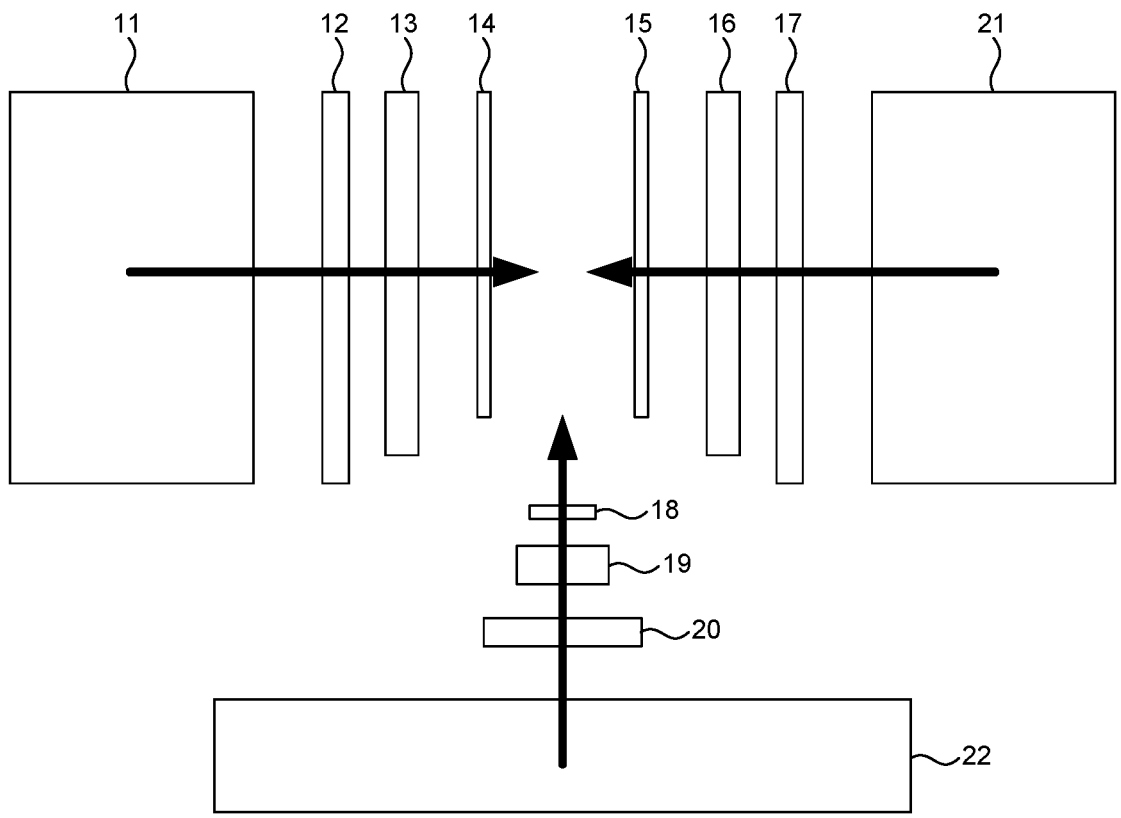
FIG. 1A is a diagram illustrative of twelve different primitive structural building blocks 11-22 assembled together to form an optical critical dimension (OCD) model 10 depicted in FIG. 1B.
Figure 1B:
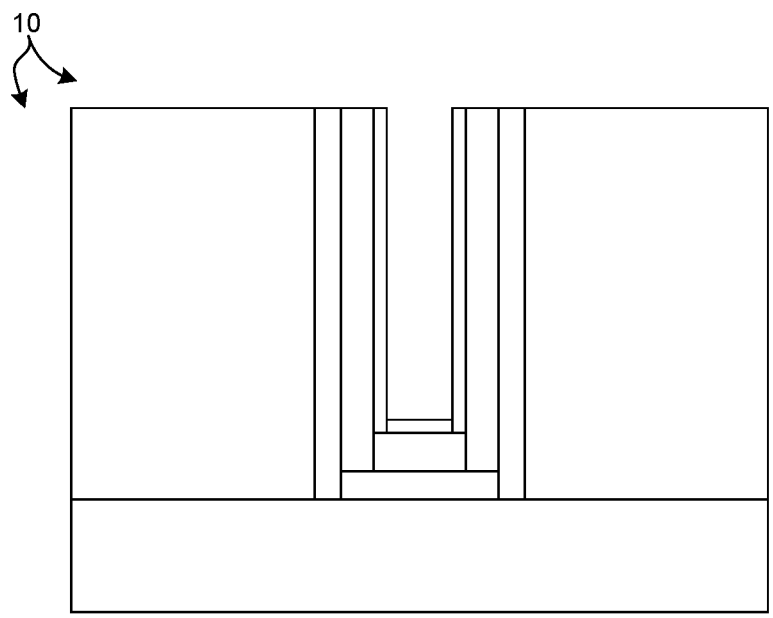
FIG. 1B is a diagram illustrative of an optical critical dimension (OCD) model 10.
Figure 2:
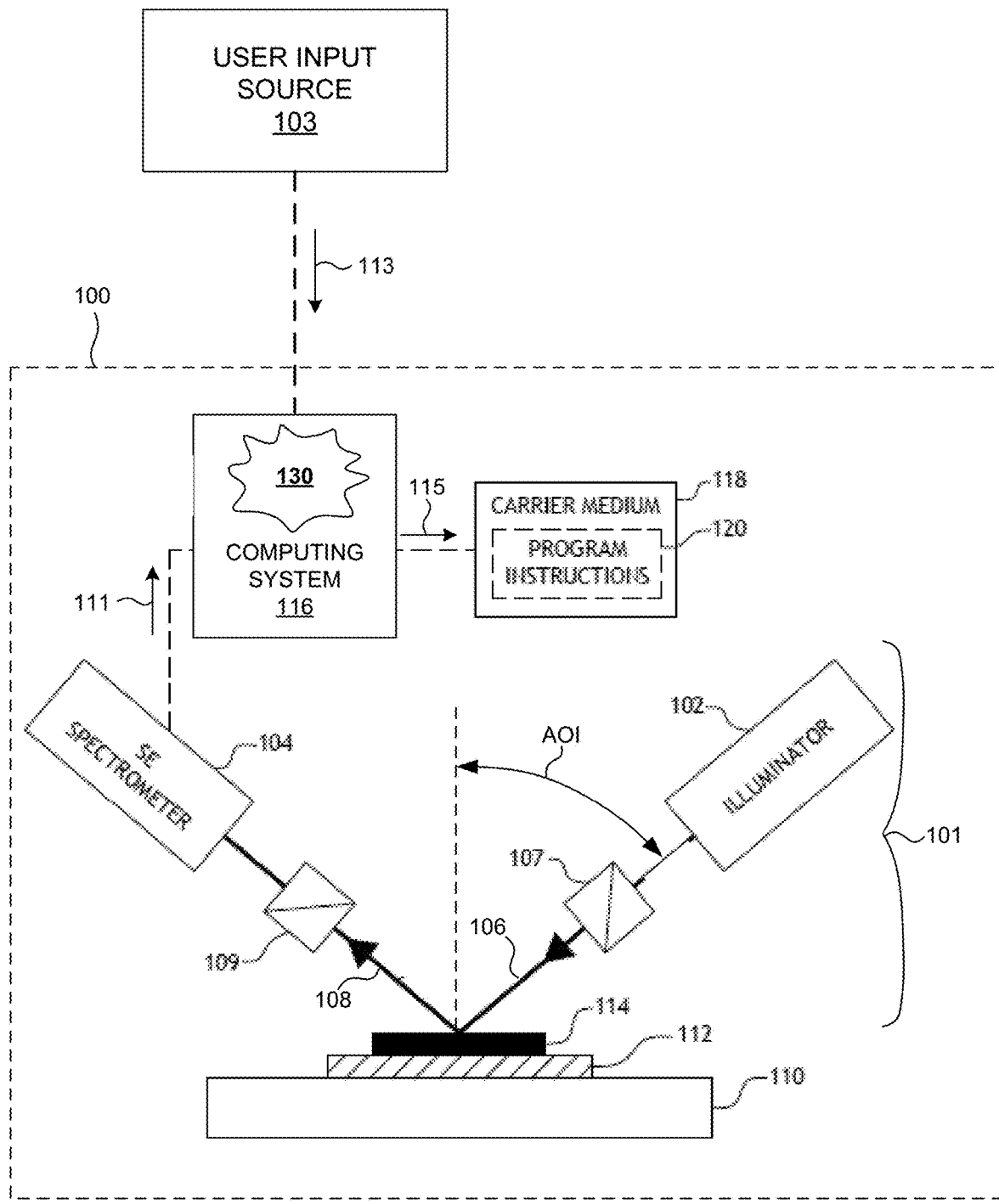
FIG. 2 is a diagram illustrative of an embodiment of a system 100 for measuring characteristics of a semiconductor wafer based on measurement models including re-useable, parametric sub-structure models of nanowire based semiconductor structures as described herein.

FIG. 2 illustrates a system 100 for measuring characteristics of a semiconductor wafer. As shown in FIG. 2, system 100 may be used to perform spectroscopic ellipsometry measurements of one or more structures 114 of a semiconductor wafer 112 disposed on a wafer positioning system 110. In this aspect, the system 100 may include a spectroscopic ellipsometer equipped with an illuminator 102 and a spectrometer 104. The illuminator 102 of the system 100 is configured to generate and direct illumination of a selected wavelength range (e.g., 150-4500 nm) to the structure 114 disposed on the surface of the semiconductor wafer 112. In turn, the spectrometer 104 is configured to receive light from the surface of the semiconductor wafer 112. It is further noted that the light emerging from the illuminator 102 is polarized using a polarization state generator 107 to produce a polarized illumination beam 106. The radiation reflected by the structure 114 disposed on the wafer 112 is passed through a polarization state analyzer 109 and to the spectrometer 104. The radiation received by a detector of spectrometer 104 in the collection beam 108 is analyzed with regard to polarization state, allowing for spectral analysis of radiation passed by the analyzer. These spectra 111 are passed to the computing system 116 for analysis of the structure 114.

In a further embodiment, the metrology system 100 is a measurement system 100 that includes one or more computing systems 116 configured to execute model building and analysis tool 130 in accordance with the description provided herein. In the preferred embodiment, model building and analysis tool 130 is a set of program instructions 120 stored on a carrier medium 118. The program instructions 120 stored on the carrier medium 118 are read and executed by computing system 116 to realize model building and analysis functionality as described herein. The one or more computing systems 116 may be communicatively coupled to the spectrometer 104. In one aspect, the one or more computing systems 116 are configured to receive measurement data 111 associated with a measurement (e.g., critical dimension, film thickness, composition, process, etc.) of the structure 114 of specimen 112. In one example, the measurement data 111 includes an indication of the measured spectral response (e.g., measured intensity as a function of wavelength) of the specimen by measurement system 100 based on the one or more sampling processes from the spectrometer 104. In some embodiments, the one or more computing systems 116 are further configured to determine specimen parameter values of structure 114 from measurement data 111.

In some examples, metrology based on optical scatterometry involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured optical intensities and modeled results.

In a further aspect, computing system 116 is configured to generate a structural model (e.g., geometric model, material model, or combined geometric and material model) of a measured structure of a specimen, generate an optical response model that includes at least one geometric parameter from the structural model, and resolve at least one specimen parameter value by performing a fitting analysis of optical measurement data with the optical response model. The analysis engine is used to compare the simulated optical response signals with measured data thereby allowing the determination of geometric as well as material properties of the sample. In the embodiment depicted in FIG. 2, computing system 116 is configured as a model building and analysis engine 130 configured to implement model building and analysis functionality as described herein.

Figure 3:
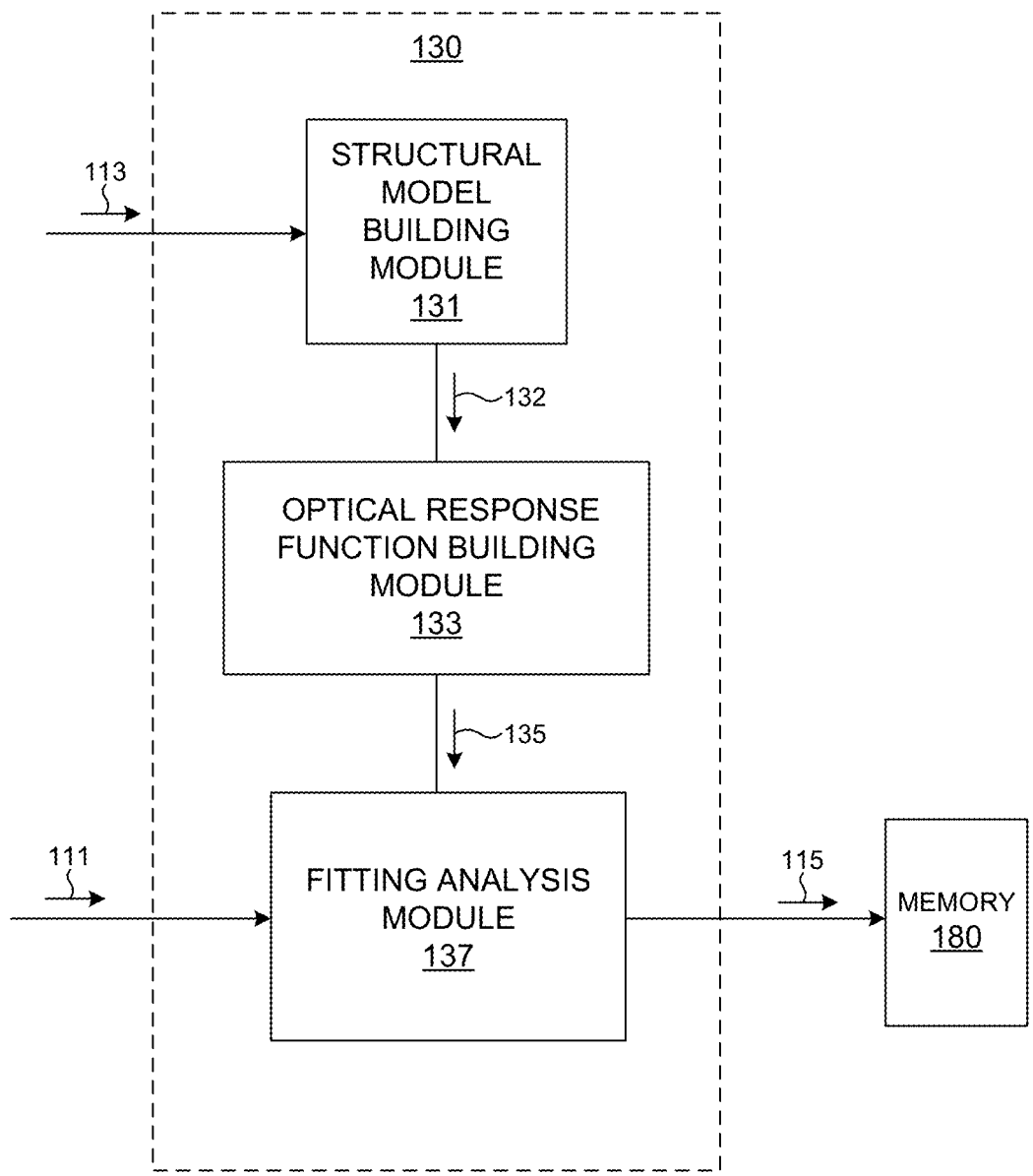
FIG. 3 is a diagram illustrative of an embodiment of a model building and analysis engine 130 configured to generate re-useable, parametric sub-structure models of nanowire based semiconductor structures as described herein.

FIG. 3 is a diagram illustrative of an exemplary model building and analysis engine 130 implemented by computing system 116. As depicted in FIG. 3, model building and analysis engine 130 includes a structural model building module 131 that generates a structural model 132 of a measured nanowire based semiconductor structure disposed on a specimen based in part on user input 113. In some embodiments, structural model 132 also includes material properties of the specimen. The structural model 132 is received as input to optical response function building module 133. Optical response function building module 133 generates an optical response function model 135 based at least in part on the structural model 132.

Optical response function model 135 is received as input to fitting analysis module 137. The fitting analysis module 137 compares the modeled optical response with the corresponding measured data 111 to determine geometric as well as material properties of the specimen.

In some examples, fitting analysis module 137 resolves at least one specimen parameter value by performing a fitting analysis on optical measurement data 111 with the optical response model 135.

The fitting of optical metrology data is advantageous for any type of optical metrology technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing light interaction with the specimen are used.

In general, computing system 116 is configured to access model parameters in real-time, employing Real Time Critical Dimensioning (RTCD), or it may access libraries of pre-computed models for determining a value of at least one specimen parameter value associated with the specimen 114. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In addition, in some embodiments, the one or more computing systems 116 are further configured to receive user input 113 from a user input source 103 such as a graphical user interface, keyboard, etc. The one or more computer systems are further configured to configure re-useable, parametric sub-structure models as described herein to generate a structural model of the nanowire based semiconductor structure under measurement (e.g., structural model 132).

In some embodiments, measurement system 100 is further configured to store one or more re-useable, parametric sub-structure models 115 in a memory (e.g., carrier medium 118).

Figure 4:
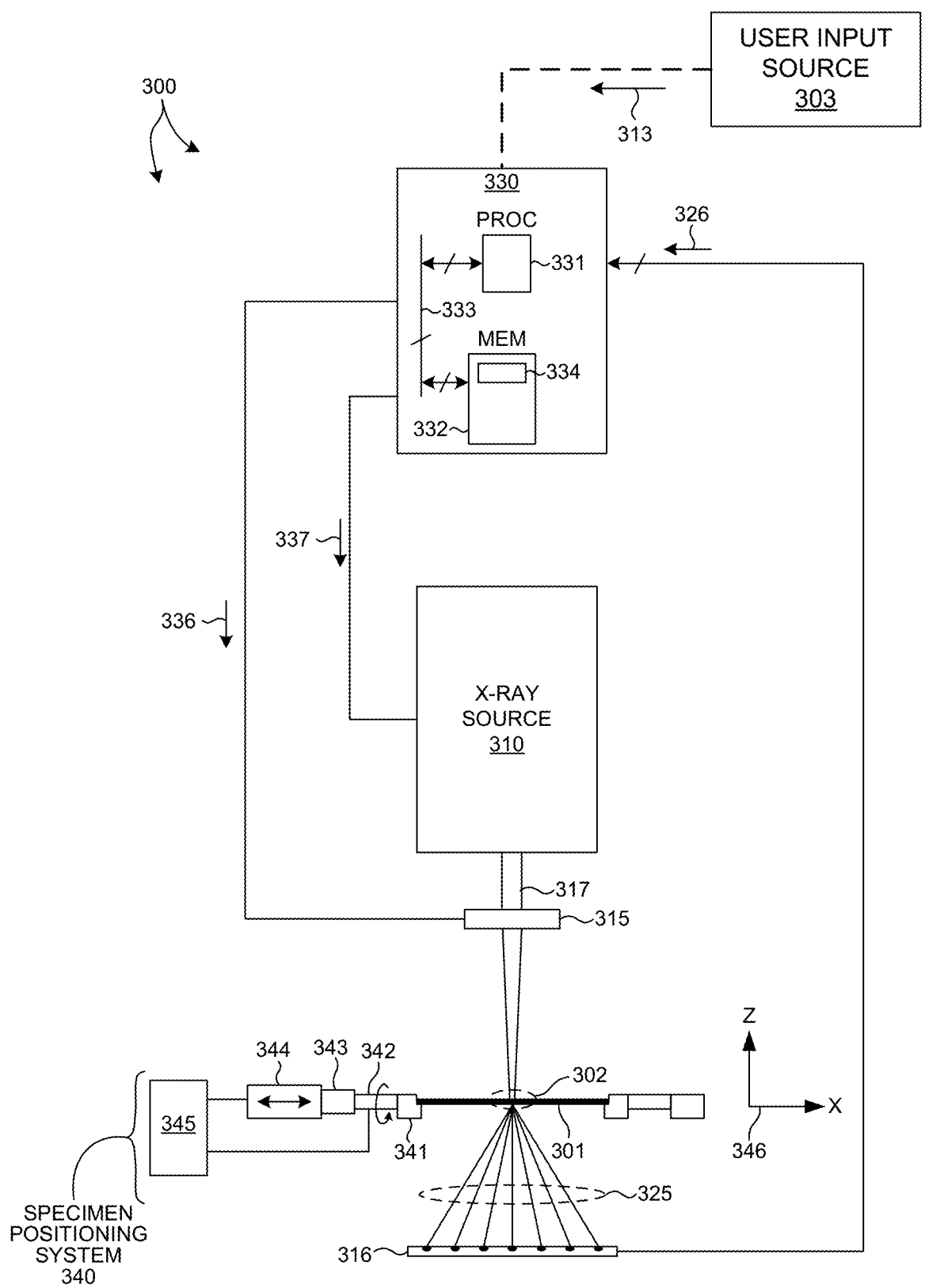
FIG. 4 is a diagram illustrative of an embodiment of a system 300 for measuring characteristics of a semiconductor wafer based on measurement models including re-useable, parametric sub-structure models of nanowire based semiconductor structures as described herein.

FIG. 4 illustrates an embodiment of an x-ray metrology tool 300 for measuring characteristics of a specimen in accordance with the exemplary methods presented herein. As shown in FIG. 4, the system 300 may be used to perform x-ray scatterometry measurements over an inspection area 302 of a specimen 301 disposed on a specimen positioning system 340. In some embodiments, the inspection area 302 has a spot size of five hundred micrometers or less. In some embodiments, the inspection area 302 has a spot size of fifty micrometers or less.

In the depicted embodiment, metrology tool 300 includes an x-ray illumination source 310 configured to generate x-ray radiation suitable for x-ray scatterometry measurements. In some embodiments, the x-ray illumination system 310 is configured to generate wavelengths between 0.01 nanometers and 1 nanometer. X-ray illumination source 310 produces an x-ray beam 317 incident on inspection area 302 of specimen 301.

In general, any suitable high-brightness x-ray illumination source capable of generating high brightness x-rays at flux levels sufficient to enable high-throughput metrology may be contemplated to supply x-ray illumination for x-ray scatterometry measurements. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV are employed to ensure that the x-ray source supplies light at wavelengths that allow sufficient transmission through the entire device as well as the wafer substrate. By way of non-limiting example, any of a particle accelerator source, a liquid anode source, a rotating anode source, a stationary, solid anode source, a microfocus source, a microfocus rotating anode source, and an inverse Compton source may be employed as x-ray source 310. In one example, an inverse Compton source available from Lyncean Technologies, Inc., Palo Alto, Calif. (USA) may be contemplated. Inverse Compton sources have an additional advantage of being able to produce x-rays over a range of photon energies, thereby enabling the x-ray source to deliver x-ray radiation at different, selectable wavelengths. In some embodiments, an x-ray source includes an electron beam source configured to bombard solid or liquid targets to stimulate x-ray radiation.

In one embodiment, the incident x-ray beam 317 is at the Indium ka line of 24.2 keV. The x-ray beam is collimated down to less than one milliradian divergence using multilayer x-ray optics for x-ray scatterometry measurements.

In some embodiments, the profile of the incident x-ray beam is controlled by one or more apertures, slits, or a combination thereof. In a further embodiment, the apertures, slits, or both, are configured to rotate in coordination with the orientation of the specimen to optimize the profile of the incident beam for each angle of incidence, azimuth angle, or both.

As depicted in FIG. 4, x-ray optics 315 shape and direct incident x-ray beam 317 to specimen 301. In some examples, x-ray optics 315 include an x-ray monochromator to monochromatize the x-ray beam that is incident on the specimen 301. In one example, a crystal monochromator such as a Loxley-Tanner-Bowen monochromator is employed to monochromatize the beam of x-ray radiation. In some examples, x-ray optics 315 collimate or focus the x-ray beam 317 onto inspection area 302 of specimen 301 to less than 1 milliradian divergence using multilayer x-ray optics. In some embodiments, x-ray optics 315 includes one or more x-ray collimating mirrors, x-ray apertures, x-ray beam stops, refractive x-ray optics, diffractive optics such as zone plates, specular x-ray optics such as grazing incidence ellipsoidal mirrors, polycapillary optics such as hollow capillary x-ray waveguides, multilayer optics, or systems, or any combination thereof. Further details are described in U.S. Patent Publication No. 2015/0110249, the content of which is incorporated herein by reference it its entirety.

In general, the focal plane of the illumination optics system is optimized for each measurement application. In this manner, system 300 is configured to locate the focal plane at various depths within the specimen depending on the measurement application.

X-ray detector 316 collects x-ray radiation 325 scattered from specimen 301 and generates an output signal 326 indicative of properties of specimen 301 that are sensitive to the incident x-ray radiation in accordance with an x-ray scatterometry measurement modality. In some embodiments, scattered x-rays 325 are collected by x-ray detector 316 while specimen positioning system 340 locates and orients specimen 301 to produce angularly resolved scattered x-rays.

In some embodiments, an x-ray scatterometry system includes one or more photon counting detectors with high dynamic range (e.g., greater than $10^5$) and thick, highly absorptive crystal substrates that absorb the direct beam (i.e., zero order beam) without damage and with minimal parasitic backscattering. In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 316 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 330 via output signals 326 for further processing and storage.

In a further aspect, x-ray scatterometry system 300 is employed to determine properties of a specimen (e.g., structural parameter values) based on one or more measured intensities. As depicted in FIG. 4, metrology system 300 includes a computing system 330 employed to acquire signals 326 generated by detector 316 and determine properties of the specimen based at least in part on the acquired signals.

In an x-ray scatterometry measurement, a structure (e.g., a high aspect ratio, vertically manufactured structure) diffracts a collimated or focused X-ray beam into diffraction orders. Each diffraction order travels in a particular, predictable direction. The angular spacing of the diffraction orders is inversely proportional to the lattice constant of the specimen divided by the wavelength. The diffraction orders are detected by a detector array placed at some distance from the wafer. Each pixel of the detector outputs a signal that indicates the number of photons that hit the pixel.

The intensities of diffraction orders are of the form I(m,n, $\theta,\phi,\lambda$), where {m,n} are integer indices of diffraction orders, {$\theta,\phi$} are elevation and azimuth angles of the incident beam (i.e., polar coordinates of the incident chief ray with respect to a coordinate system that is fixed to the wafer), and $\lambda$ is the wavelength of the incident X-ray.

Several noise sources perturb the illumination light as it exits the illumination and propagates toward the specimen. Exemplary disturbances include electron beam current fluctuation, temperature induced optic drift, etc. The perturbed incident flux is denoted as $F_0 (1+n_1)$.

The target scatters the incident radiation in a manner that depends on the azimuth and elevation angles of the incident beam. The efficiency of light scattering into orders (m,n) can be defined as $S_{mn}(\theta,\phi)$. As the diffracted light propagates from the specimen to the detector, the beam passes through other scattering media that affect all orders similarly with some variation $(1+n_2)$ and parasitic noise $(n_3)$. In this manner the total intensity $I_{mn}$ of each order measured in a time, t, can be expressed by equation (1).

$$I_{mn}=S_{mn}(\theta,\phi)(1+n_2)(1+n_1)F_0 t+n_3 \quad (1)$$

In some embodiments, it is desirable to perform measurements at different orientations described by rotations about the x and y axes indicated by coordinate system 346 depicted in FIG. 4. This increases the precision and accuracy of measured parameters and reduces correlations among parameters by extending the number and diversity of data sets available for analysis to include a variety of large-angle, out of plane orientations. Measuring specimen parameters with a deeper, more diverse data set also reduces correlations among parameters and improves measurement accuracy. For example, in a normal orientation, x-ray scatterometry is able to resolve the critical dimension of a feature, but is largely insensitive to sidewall angle and height of a feature. However, by collecting measurement data over a broad range of out of plane angular positions, the sidewall angle and height of a feature can be resolved.

As illustrated in FIG. 4, metrology tool 300 includes a specimen positioning system 340 configured to both align specimen 301 and orient specimen 301 over a large range of out of plane angular orientations with respect the scatterometer. In other words, specimen positioning system 340 is configured to rotate specimen 301 over a large angular range about one or more axes of rotation aligned in-plane with the surface of specimen 301. In some embodiments, specimen positioning system is configured to rotate specimen 301 within a range of at least 120 degrees about one or more axes of rotation aligned in-plane with the surface of specimen 301. In this manner, angle resolved measurements of specimen 301 are collected by metrology system 300 over any number of locations on the surface of specimen 301. In one example, computing system 330 communicates command signals to motion controller 345 of specimen positioning system 340 that indicate the desired position of specimen 301. In response, motion controller 345 generates command signals to the various actuators of specimen positioning system 340 to achieve the desired positioning of specimen 301.

By way of non-limiting example, as illustrated in FIG. 4, specimen positioning system 340 includes an edge grip chuck 341 to fixedly attach specimen 301 to specimen positioning system 340. A rotational actuator 342 is configured to rotate edge grip chuck 341 and the attached specimen 301 with respect to a perimeter frame 343. In the depicted embodiment, rotational actuator 342 is configured to rotate specimen 301 about the x-axis of the coordinate system 346 illustrated in FIG. 4. As depicted in FIG. 4, a rotation of specimen 301 about the z-axis is an in plane rotation of specimen 301. Rotations about the x-axis and the y-axis (not shown) are out of plane rotations of specimen 301 that effectively tilt the surface of the specimen with respect to the metrology elements of metrology system 300. Although it is not illustrated, a second rotational actuator is configured to rotate specimen 301 about the y-axis. A linear actuator 344 is configured to translate perimeter frame 343 in the x-direction. Another linear actuator (not shown) is configured to translate perimeter frame 343 in the y-direction. In this manner, every location on the surface of specimen 301 is available for measurement over a range of out of plane angular positions. For example, in one embodiment, a location of specimen 301 is measured over several angular increments within a range of −45 degrees to +45 degrees with respect to the normal orientation of specimen 301.

In general, specimen positioning system 340 may include any suitable combination of mechanical elements to achieve the desired linear and angular positioning performance, including, but not limited to goniometer stages, hexapod stages, angular stages, and linear stages.

In some examples, metrology based on x-ray scatterometry involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

In a further aspect, computing system 330 is configured to generate a structural model (e.g., geometric model, material model, or combined geometric and material model) of a measured structure of a specimen, generate a x-ray scatterometry response model that includes at least one geometric parameter from the structural model, and resolve at least one specimen parameter value by performing a fitting analysis of x-ray scatterometry measurement data with the x-ray scatterometry response model. The analysis engine is used to compare the simulated x-ray scatterometry signals with measured data thereby allowing the determination of geometric as well as material properties such as electron density of the sample. In the embodiment depicted in FIG. 4, computing system 330 is configured as a model building and analysis engine 350 configured to implement model building and analysis functionality as described herein.

Figure 5:
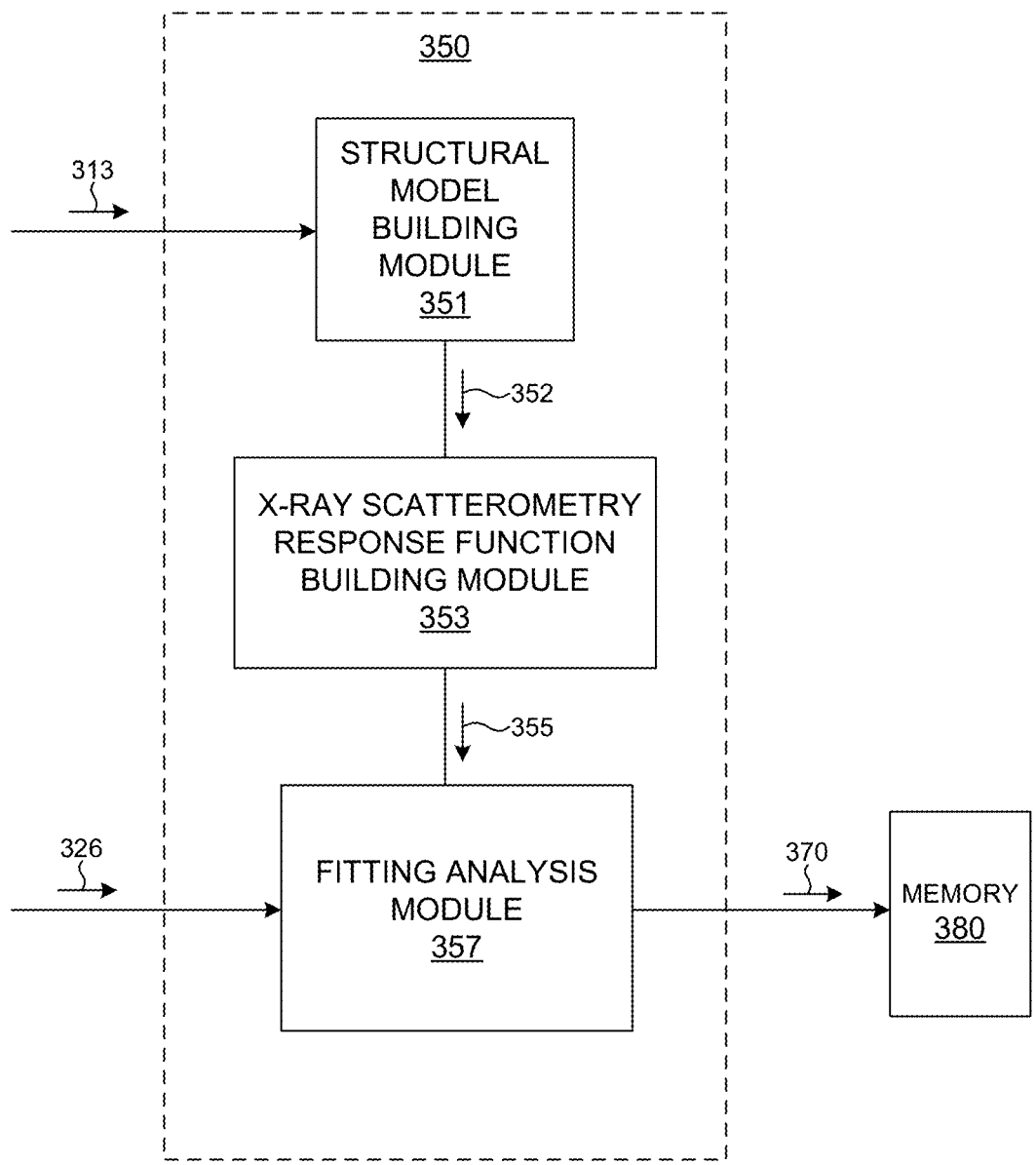
FIG. 5 is a diagram illustrative of an embodiment of a model building and analysis engine 350 configured to generate re-useable, parametric sub-structure models of nanowire based semiconductor structures as described herein.

FIG. 5 is a diagram illustrative of an exemplary model building and analysis engine 350 implemented by computing system 330. As depicted in FIG. 5, model building and analysis engine 350 includes a structural model building module 351 that generates a structural model 352 of a measured nanowire based semiconductor structure disposed on a specimen based in part on user input 313 received from a user input source 303 (e.g., a graphical user interface, keyboard, etc.). In some embodiments, structural model 352 also includes material properties of the specimen. The structural model 352 is received as input to x-ray scatterometry response function building module 353. X-ray scatterometry response function building module 353 generates a x-ray scatterometry response function model 355 based at least in part on the structural model 352. In some examples, the x-ray scatterometry response function model 355 is based on x-ray form factors, $$F(\vec{q}) = \int \rho(\vec{r}) e^{-i\vec{q}\cdot\vec{r}} d\vec{r} \quad (2)$$

where F is the form factor, q is the scattering vector, and $\rho(r)$ is the electron density of the specimen in spherical coordinates. The x-ray scattering intensity is then given by $$I(\vec{q}) = F^*F \quad (3)$$

X-ray scatterometry response function model 355 is received as input to fitting analysis module 357. The fitting analysis module 357 compares the modeled x-ray scatterometry response with the corresponding measured data 326 to determine geometric as well as material properties of the specimen.

In some examples, the fitting of modeled data to experimental data is achieved by minimizing a chi-squared value.

For example, for x-ray scatterometry measurements, a chi-squared value can be defined as $$\chi^2_{SAXS} = \frac{1}{N_{SAXS}} \sum_{j}^{N_{SAXS}} \frac{\left( S_j^{SAXS\ model}(v_1, \ldots, v_L) - S_j^{SAXS\ experiment} \right)^2}{\sigma^2_{SAXS,j}} \quad (4)$$

Where, $S_j^{SAXS\ experiment}$ is the measured x-ray scatterometry signals 326 in the "channel" j, where the index j describes a set of system parameters such as diffraction order, energy, angular coordinate, etc. $S_j^{SAXS\ model}(v_1, \ldots v_L)$ is the modeled x-ray scatterometry signal $S_j$ for the "channel" j, evaluated for a set of structure (target) parameters $v_1, \ldots, v_L$, where these parameters describe geometric (CD, sidewall angle, overlay, etc.) and material (electron density, etc.). $\sigma_{SAXS,j}$ is the uncertainty associated with the jth channel. $N_{SAXS}$ is the total number of channels in the x-ray metrology. L is the number of parameters characterizing the metrology target.

Equation (4) assumes that the uncertainties associated with different channels are uncorrelated. In examples where the uncertainties associated with the different channels are correlated, a covariance between the uncertainties, can be calculated. In these examples a chi-squared value for x-ray scatterometry measurements can be expressed as $$\chi^2_{SAXS} = \frac{1}{N_{SAXS}} \left( \vec{S}_j^{SAXS.\ model}(v_1, \ldots, v_M) - \vec{S}_j^{SAXS.\ experiment} \right)^T \quad (5)$$
$$V_{SAXS}^{-1} \left( \vec{S}_j^{SAXS.\ model}(v_1, \ldots, v_M) - \vec{S}_j^{SAXS.\ experiment} \right)$$

where, $V_{SAXS}$ is the covariance matrix of the SAXS channel uncertainties, and T denotes the transpose.

In some examples, fitting analysis module 357 resolves at least one specimen parameter value by performing a fitting analysis on x-ray scatterometry measurement data 326 with the x-ray scatterometry response model 355. In some examples, $\chi^2_{SAXS}$ is optimized.

As described hereinbefore, the fitting of x-ray scatterometry data is achieved by minimization of chi-squared values. However, in general, the fitting of x-ray scatterometry data may be achieved by other functions.

The fitting of x-ray scatterometry metrology data is advantageous for any type of x-ray scatterometry technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing x-ray scatterometry beam interaction with the specimen are used.

In general, computing system 330 is configured to access model parameters in real-time, employing Real Time Critical Dimensioning (RTCD), or it may access libraries of pre-computed models for determining a value of at least one specimen parameter value associated with the specimen 301. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

Figure 22:
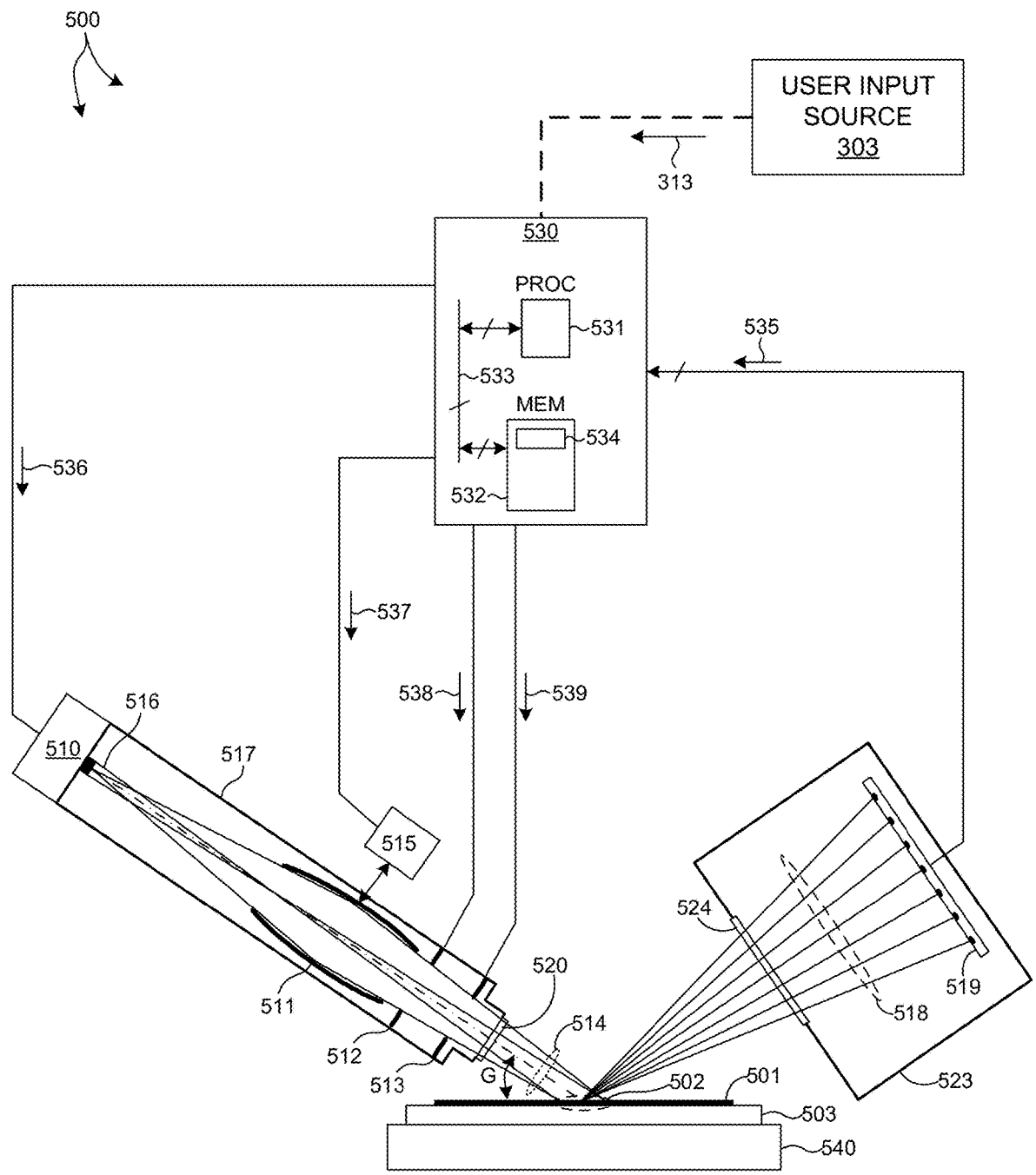
FIG. 22 is a diagram illustrative of an embodiment of a system 500 for measuring characteristics of a semiconductor wafer based on measurement models including re-useable, parametric sub-structure models of nanowire based semiconductor structures as described herein.

FIG. 22 illustrates an embodiment of a soft x-ray reflectometry (SXR) metrology tool 500 for measuring characteristics of a specimen. In some embodiments, SXR measurements of a semiconductor wafer are performed over a range of wavelengths, angles of incidence, and azimuth angles with a small beam spot size (e.g., less than 50 micrometers across the effective illumination spot). In one aspect, the SXR measurements are performed with x-ray radiation in the soft x-ray region (i.e., 30-3000 eV) at grazing angles of incidence in the range of 5-20 degrees. Grazing angles for a particular measurement application are selected to achieve a desired penetration into the structure under measurement and maximize measurement information content with a small beam spot size (e.g., less than 50 micrometers).

As illustrated in FIG. 22, the system 500 performs SXR measurements over a measurement area 502 of a specimen 501 illuminated by an incident illumination beam spot.

In the depicted embodiment, metrology tool 500 includes an x-ray illumination source 510, focusing optics 511, beam divergence control slit 512, and slit 513. The x-ray illumination source 510 is configured to generate Soft X-ray radiation suitable for SXR measurements. X-ray illumination source 510 is a polychromatic, high-brightness, large etendue source. In some embodiments, the x-ray illumination source 510 is configured to generate x-ray radiation in a range between 30-3000 electron-volts. In general, any suitable high-brightness x-ray illumination source capable of generating high brightness Soft X-ray at flux levels sufficient to enable high-throughput, inline metrology may be contemplated to supply x-ray illumination for SXR measurements.

In some embodiments, an x-ray source includes a tunable monochromator that enables the x-ray source to deliver x-ray radiation at different, selectable wavelengths. In some embodiments, one or more x-ray sources are employed to ensure that the x-ray source supplies light at wavelengths that allow sufficient penetration into the specimen under measurement.

In some embodiments, illumination source 510 is a high harmonic generation (HHG) x-ray source. In some other embodiments, illumination source 510 is a wiggler/undulator synchrotron radiation source (SRS). An exemplary wiggler/undulator SRS is described in U.S. Pat. Nos. 8,941,336 and 8,749,179, the contents of which are incorporated herein by reference in their entireties.

In some other embodiments, illumination source 110 is a laser produced plasma (LPP) light source. In some of these embodiments the LPP light source includes any of Xenon, Krypton, Argon, Neon, and Nitrogen emitting materials. In general, the selection of a suitable LPP target material is optimized for brightness in resonant Soft X-ray regions. For example, plasma emitted by Krypton provides high brightness at the Silicon K-edge. In another example, plasma emitted by Xenon provides high brightness throughout the entire Soft X-ray region of (80-3000 eV). As such, Xenon is a good choice of emitting material when broadband Soft X-ray illumination is desired.

LPP target material selection may also be optimized for reliable and long lifetime light source operation. Noble gas target materials such as Xenon, Krypton, and Argon are inert and can be reused in a closed loop operation with minimum or no decontamination processing. An exemplary Soft X-ray illumination source is described in U.S. patent application Ser. No. 15/867,633, the content of which is incorporated herein by reference in its entirety.

In a further aspect, the wavelengths emitted by the illumination source (e.g., illumination source 510) are selectable. In some embodiments, illumination source 510 is a LPP light source controlled by computing system 530 to maximize flux in one or more selected spectral regions. Laser peak intensity at the target material controls the plasma temperature and thus the spectral region of emitted radiation. Laser peak intensity is varied by adjusting pulse energy, pulse width, or both. In one example, a 100 picosecond pulse width is suitable for generating Soft X-ray radiation. As depicted in FIG. 22, computing system 530 communicates command signals 536 to illumination source 510 that cause illumination source 510 to adjust the spectral range of wavelengths emitted from illumination source 510. In one example, illumination source 510 is a LPP light source, and the LPP light source adjusts any of a pulse duration, pulse frequency, and target material composition to realize a desired spectral range of wavelengths emitted from the LPP light source.

By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 510.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

X-ray illumination source 510 produces x-ray emission over a source area having finite lateral dimensions (i.e., non-zero dimensions orthogonal to the beam axis. In one aspect, the source area of illumination source 510 is characterized by a lateral dimension of less than 20 micrometers. In some embodiments, the source area is characterized by a lateral dimension of 10 micrometers or less. Small source size enables illumination of a small target area on the specimen with high brightness, thus improving measurement precision, accuracy, and throughput.

In general, x-ray optics shape and direct x-ray radiation to specimen 501. In some examples, the x-ray optics collimate or focus the x-ray beam onto measurement area 502 of specimen 501 to less than 1 milliradian divergence using multilayer x-ray optics. In some embodiments, the x-ray optics include one or more x-ray collimating mirrors, x-ray apertures, x-ray beam stops, refractive x-ray optics, diffractive optics such as zone plates, Schwarzschild optics, Kirkpatrick-Baez optics, Montel optics, Wolter optics, specular x-ray optics such as ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

As depicted in FIG. 22, focusing optics 511 focuses source radiation onto a metrology target located on specimen 501. The finite lateral source dimension results in finite spot size 502 on the target defined by the rays 516 coming from the edges of the source and any beam shaping provided by beam slits 512 and 513.

In some embodiments, focusing optics 511 includes elliptically shaped focusing optical elements. In the embodiment depicted in FIG. 22, the magnification of focusing optics 511 at the center of the ellipse is approximately one. As a result, the illumination spot size projected onto the surface of specimen 501 is approximately the same size as the illumination source, adjusted for beam spread due to the nominal grazing incidence angle (e.g., 5-20 degrees).

In a further aspect, focusing optics 511 collect source emission and select one or more discrete wavelengths or spectral bands, and focus the selected light onto specimen 501 at grazing angles of incidence in the range 5-20 degrees.

The nominal grazing incidence angle is selected to achieve a desired penetration of the metrology target to maximize signal information content while remaining within metrology target boundaries. The critical angle of hard x-rays is very small, but the critical angle of soft x-rays is significantly larger. As a result of this additional measurement flexibility SXR measurements probe more deeply into the structure with less sensitivity to the precise value of the grazing incidence angle.

In some embodiments, focusing optics 511 include graded multi-layers that select desired wavelengths or ranges of wavelengths for projection onto specimen 501. In some examples, focusing optics 511 includes a graded multi-layer structure (e.g., layers or coatings) that selects one wavelength and projects the selected wavelength onto specimen 501 over a range of angles of incidence. In some examples, focusing optics 511 includes a graded multi-layer structure that selects a range of wavelengths and projects the selected wavelengths onto specimen 501 over one angle of incidence. In some examples, focusing optics 511 includes a graded multi-layer structure that selects a range of wavelengths and projects the selected wavelengths onto specimen 501 over a range of angles of incidence.

Graded multi-layered optics are preferred to minimize loss of light that occurs when single layer grating structures are too deep. In general, multi-layer optics select reflected wavelengths. The spectral bandwidth of the selected wavelengths optimizes flux provided to specimen 501, information content in the measured diffracted orders, and prevents degradation of signal through angular dispersion and diffraction peak overlap at the detector. In addition, graded multi-layer optics are employed to control divergence. Angular divergence at each wavelength is optimized for flux and minimal spatial overlap at the detector.

In some examples, graded multi-layer optics select wavelengths to enhance contrast and information content of diffraction signals from specific material interfaces or structural dimensions. For example, the selected wavelengths may be chosen to span element-specific resonance regions (e.g., Silicon K-edge, Nitrogen, Oxygen K-edge, etc.). In addition, in these examples, the illumination source may also be tuned to maximize flux in the selected spectral region (e.g., HHG spectral tuning, LPP laser tuning, etc.)

In some embodiments, focusing optics 511 include a plurality of reflective optical elements each having an elliptical surface shape. Each reflective optical element includes a substrate and a multi-layer coating tuned to reflect a different wavelength or range of wavelengths. In some embodiments, a plurality of reflective optical elements (e.g., 1-5) each reflecting a different wavelength or range of wavelengths are arranged at each angle of incidence. In a further embodiment, multiple sets (e.g., 2-5) of reflective optical elements each reflecting a different wavelength or range of wavelengths are arranged each at set at a different angle of incidence. In some embodiments, the multiple sets of reflective optical elements simultaneously project illumination light onto specimen 501 during measurement. In some other embodiments, the multiple sets of reflective optical elements sequentially project illumination light onto specimen 501 during measurement. In these embodiments, active shutters or apertures are employed to control the illumination light projected onto specimen 501.

In some embodiments, focusing optics 511 focus light at multiple wavelengths, azimuths and AOI on the same metrology target area.

In a further aspect, the ranges of wavelengths, AOI, Azimuth, or any combination thereof, projected onto the same metrology area, are adjusted by actively positioning one or more mirror elements of the focusing optics. As depicted in FIG. 22, computing system 530 communicates command signals to actuator system 515 that causes actuator system 515 to adjust the position, alignment, or both, of one or more of the optical elements of focusing optics 511 to achieve the desired ranges of wavelengths, AOI, Azimuth, or any combination thereof, projected onto specimen 501.

In general, the angle of incidence is selected for each wavelength to optimize penetration and absorption of the illumination light by the metrology target under measurement. In many examples, multiple layer structures are measured and angle of incidence is selected to maximize signal information associated with the desired layers of interest. In the example of overlay metrology, the wavelength(s) and angle(s) of incidence are selected to maximize signal information resulting from interference between scattering from the previous layer and the current layer. In addition, azimuth angle is also selected to optimize signal information content. In addition, azimuth angle is selected to ensure angular separation of diffraction peaks at the detector.

In a further aspect, an RSAX metrology system (e.g., metrology tool 500) includes one or more beam slits or apertures to shape the illumination beam 514 incident on specimen 501 and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to minimize overlap of diffraction orders on the detector.

In another further aspect, an RSAX metrology system (e.g., metrology tool 500) includes one or more beam slits or apertures to select a set of illumination wavelengths that simultaneously illuminate a metrology target under measurement. In some embodiments, illumination including multiple wavelengths is simultaneously incident on a metrology target under measurement. In these embodiments, one or more slits are configured to pass illumination including multiple illumination wavelengths. In general, simultaneous illumination of a metrology target under measurement is preferred to increase signal information and throughput. However, in practice, overlap of diffraction orders at the detector limits the range of illumination wavelengths. In some embodiments, one or more slits are configured to sequentially pass different illumination wavelengths. In some examples, sequential illumination at larger angular divergence provides higher throughput because the signal to noise ratio for sequential illumination may be higher compared to simultaneous illumination when beam divergence is larger. When measurements are performed sequentially the problem of overlap of diffraction orders is not an issue. This increases measurement flexibility and improves signal to noise ratio.

FIG. 22 depicts a beam divergence control slit 512 located in the beam path between focusing optics 511 and beam shaping slit 513. Beam divergence control slit 512 limits the divergence of the illumination provided to the specimen under measurement. Beam shaping slit 513 is located in the beam path between beam divergence control slit 512 and specimen 501. Beam shaping slit 513 further shapes the incident beam 514 and selects the illumination wavelength(s) of incident beam 514. Beam shaping slit 513 is located in the beam path immediately before specimen 501. In one aspect, the slits of beam shaping slit 513 are located in close proximity to specimen 501 to minimize the enlargement of the incident beam spot size due to beam divergence defined by finite source size.

In some embodiments, beam shaping slit 513 includes multiple, independently actuated beam shaping slits. In one embodiment, beam shaping slit 513 includes four independently actuated beam shaping slits. These four beams shaping slits effectively block a portion of the incoming beam and generate an illumination beam 514 having a box shaped illumination cross-section.

Slits of beam shaping slit 513 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit.

X-ray detector 519 collects x-ray radiation 518 scattered from specimen 501 and generates an output signals 535 indicative of properties of specimen 501 that are sensitive to the incident x-ray radiation in accordance with a SXR measurement modality. In some embodiments, scattered x-rays 518 are collected by x-ray detector 519 while specimen positioning system 540 locates and orients specimen 501 to produce angularly resolved scattered x-rays.

In some embodiments, a SXR system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 119 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 530 via output signals 535 for further processing and storage.

Diffraction patterns resulting from simultaneous illumination of a periodic target with multiple illumination wavelengths are separated at the detector plane due to angular dispersion in diffraction. In these embodiments, integrating detectors are employed. The diffraction patterns are measured using area detectors, e.g., vacuum-compatible backside CCD or hybrid pixel array detectors. Angular sampling is optimized for Bragg peak integration. If pixel level model fitting is employed, angular sampling is optimized for signal information content. Sampling rates are selected to prevent saturation of zero order signals.

In a further aspect, a SXR system is employed to determine properties of a specimen (e.g., structural parameter values) based on one or more diffraction orders of scattered light. As depicted in FIG. 22, metrology tool 500 includes a computing system 530 employed to acquire signals 535 generated by detector 519 and determine properties of the specimen based at least in part on the acquired signals.

It is desirable to perform measurements at large ranges of wavelength, angle of incidence and azimuth angle to increase the precision and accuracy of measured parameter values. This approach reduces correlations among parameters by extending the number and diversity of data sets available for analysis.

Measurements of the intensity of diffracted radiation as a function of illumination wavelength and x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

In one aspect, metrology tool 500 includes a wafer chuck 503 that fixedly supports wafer 501 and is coupled to specimen positioning system 540. Specimen positioning system 540 configured to actively position specimen 501 in six degrees of freedom with respect to illumination beam 514. In one example, computing system 530 communicates command signals (not shown) to specimen positioning system 540 that indicate the desired position of specimen 501. In response, specimen positioning system 540 generates command signals to the various actuators of specimen positioning system 540 to achieve the desired positioning of specimen 501.

In a further aspect, the focusing optics of an SXR system projects an image of the illumination source onto the specimen under measurement with a demagnification of at least five (i.e., magnification factor of 0.2 or less). An SXR system as described herein employs a Soft X-ray illumination source having a source area characterized by a lateral dimension of 20 micrometers or less (i.e., source size is 20 micrometers or smaller). In some embodiments, focusing optics are employed with a demagnification factor of at least five (i.e., project an image of the source onto the wafer that is five times smaller than the source size) to project illumination onto a specimen with an incident illumination spot size of four micrometers or less.

In some examples, metrology based on SXR involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

Additional description of soft x-ray based metrology systems is provided in U.S. Patent Publication No. 2019/0017946, the content of which is incorporated herein by reference in its entirety.

In another further aspect, computing system 530 is configured to generate a structural model (e.g., geometric model, material model, or combined geometric and material model) of a measured structure of a specimen, generate a SXR response model that includes at least one geometric parameter from the structural model, and resolve at least one specimen parameter value by performing a fitting analysis of SXR measurement data with the SXR response model. The analysis engine is used to compare the simulated SXR signals with measured data thereby allowing the determination of geometric as well as material properties such as electron density of the sample. In the embodiment depicted in FIG. 22, computing system 530 is configured as a model building and analysis engine (e.g., model building and analysis engine 350) configured to implement model building and analysis functionality as described with reference to FIG. 5.

In some examples, model building and analysis engines 130 and 350 improve the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

It should be recognized that the various steps described throughout the present disclosure may be carried out by single computer systems 116, 330, and 530, or, alternatively, multiple computer systems 116, 330, and 530. Moreover, different subsystems of systems 100, 300, and 500, such as the spectroscopic ellipsometer 101, may include a computer system suitable for carrying out at least a portion of the steps described herein. Therefore, the aforementioned description should not be interpreted as a limitation on the present invention but merely an illustration. Further, the one or more computing systems 116 may be configured to perform any other step(s) of any of the method embodiments described herein.

The computing systems 116, 330, and 530 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium. In general, computing systems 116, 330, and 530 may be integrated with a measurement system such as measurement systems 100, 300, and 500, respectively, or alternatively, may be separate from any measurement system. In this sense, computing systems 116, 330, and 530 may be remotely located and receive measurement data and user input from any measurement source and user input source, respectively.

Program instructions 120 implementing methods such as those described herein may be transmitted over or stored on carrier medium 118. The carrier medium may be a transmission medium such as a wire, cable, or wireless transmission link. The carrier medium may also include a computer-readable medium such as a read-only memory, a random access memory, a magnetic or optical disk, or a magnetic tape.

Similarly, program instructions 334 implementing methods such as those described herein may be transmitted over a transmission medium such as a wire, cable, or wireless transmission link. For example, as illustrated in FIG. 4, program instructions stored in memory 332 are transmitted to processor 331 over bus 333. Program instructions 334 are stored in a computer readable medium (e.g., memory 332). Exemplary computer-readable media include read-only memory, a random access memory, a magnetic or optical disk, or a magnetic tape.

Similarly, program instructions 534 implementing methods such as those described herein may be transmitted over a transmission medium such as a wire, cable, or wireless transmission link. For example, as illustrated in FIG. 22, program instructions stored in memory 532 are transmitted to processor 531 over bus 533. Program instructions 534 are stored in a computer readable medium (e.g., memory 532). Exemplary computer-readable media include read-only memory, a random access memory, a magnetic or optical disk, or a magnetic tape.

Nanowire based semiconductor devices are also known as gate all around devices. The semiconductor channel is the nanowire. The nanowire is wrapped all around by a series of materials that form the gate of the device. The wrapper materials include materials such as silicon dioxide, hafnium oxide, titanium nitride, tantalum nitride, etc. The wrapper materials are deposited on the nanowire using an atomic layer deposition process forming a wrapping gate all around the nanowire channel.

Figure 6:
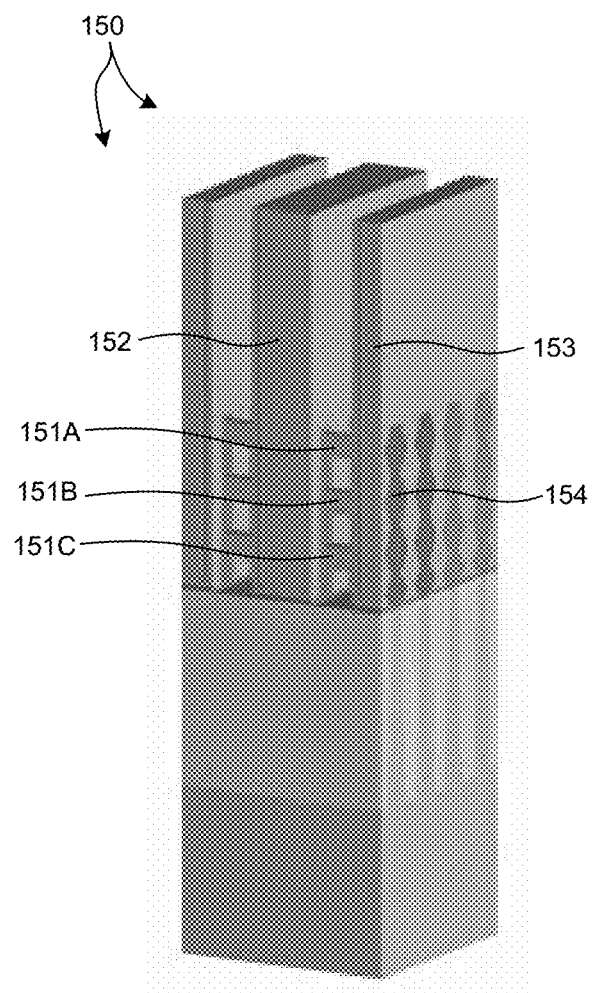
FIG. 6 is a diagram illustrative of a nanowire based semiconductor structure 150.

FIG. 6 depicts a nanowire based semiconductor structure 150. Structure 150 includes nanowires 151A-C, source/drain structures 152 and 153, and dielectric material 154. As illustrated in FIG. 6, nanowires 151A-C extend unsupported between source/drain structures 152 and 153. As a result, there are voids between adjacent nanowires.

In one aspect, a model building tool, e.g., model building and analysis engines 130 and 350, includes re-useable, parametric models of complex nanowire based semiconductor device sub-structures that are useable as building blocks in a model of a complex nanowire based semiconductor device. This makes the model building process more intuitive and less error-prone. Furthermore, because the re-useable, parametric sub-structure models are optimized for specific nanowire based structures and measurement applications, the resulting discretized measurement model is computationally more efficient than traditional models. In addition, the parametric sub-structure models can be saved and shared among different projects and different users.

In one aspect, a new set of parametric sub-structure models (i.e., primitive nanowire building blocks) employed to accurately model the geometry of next generation semiconductor devices based on nanowire fabrication processes are described. In some examples, these primitive nanowire building blocks allow a user to build measurement models that represent actual nanowire geometries with high accuracy and allow all possible degrees of freedom. In some examples, metrology systems employ these models to perform model based measurements of geometric parameters, material characteristics, etc., associated with different nanowire fabrication processes.

In a further aspect, the re-useable, parametric sub-structure model is fully defined by the values of the independent parameters entered by the user of the model building tool. All other variables associated with the model shape and internal constraints among constituent geometric elements are pre-defined within the model. Thus, beyond the values of the independent parameters, no other user input is required to fully define the re-useable, parametric sub-structure model. This greatly simplifies the model building process.

Each primitive nanowire building block is fully defined by the values of the independent parameters entered by the user. No other user input is required to define the shape of the primitive nanowire building block. This significantly simplifies the model building process associated with nanowire based semiconductor structures. This leads to much faster modeling of complex, nanowire based, semiconductor devices with fewer errors.

By way of non-limiting example, FIGS. 7-13 depict several different primitive nanowire building blocks.

Figure 7:
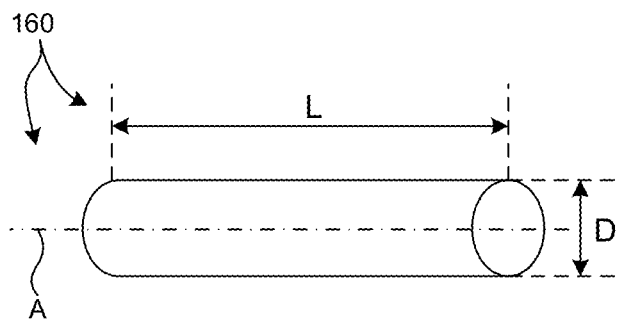
FIG. 7 is a diagram illustrative of a cylindrically shaped primitive nanowire building block 160.

FIG. 7 depicts a cylindrically shaped primitive nanowire building block 160. Cylindrical nanowire building block 160 is parameterized by a length, L, a diameter, D, an orientation angle in a plane parallel with the surface of the wafer substrate, and one or more material parameters. The orientation angle determines the orientation of the cylindrical nanowire 160 in a plane parallel with the surface of the wafer substrate.

Figure 8:
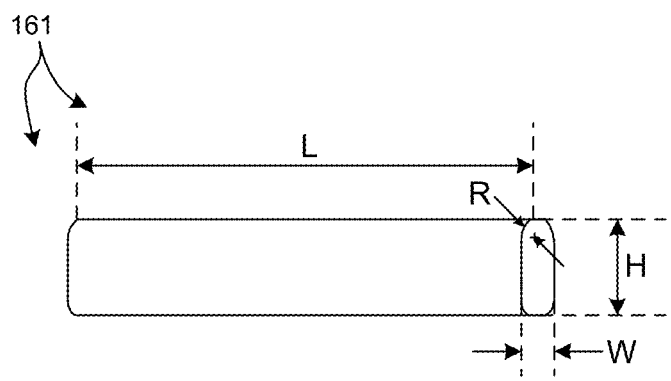
FIG. 8 is a diagram illustrative of a square shaped primitive nanowire building block 161 having rounded edges.

FIG. 8 depicts a square shaped primitive nanowire building block 161 having rounded edges. Square shaped nanowire building block 161 is parameterized by a length, L, a cross-sectional height, H, a cross-sectional width, W, a round-over radius, R, at each corner, an orientation angle in a plane parallel with the surface of the wafer substrate, and one or more material parameters.

Figure 9:
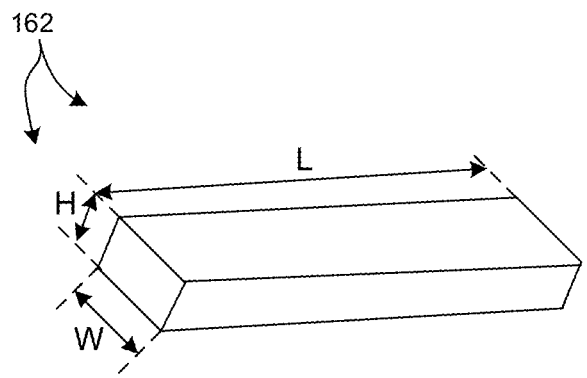
FIG. 9 is a diagram illustrative of a rectangular or slab shaped primitive nanowire building block 162.

FIG. 9 depicts a rectangular or slab shaped primitive nanowire building block 162. Slab shaped nanowire building block 162 is parameterized by a length, L, a cross-sectional height, H, a cross-sectional width, W, an orientation angle in a plane parallel with the surface of the wafer substrate, and one or more material parameters.

Figure 10:
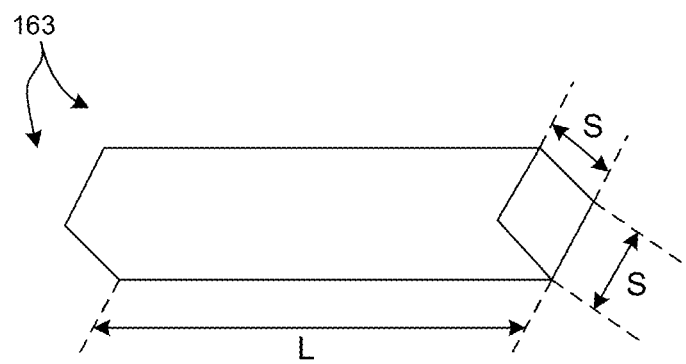
FIG. 10 is a diagram illustrative of a hexagonal shaped primitive nanowire building block 163.

FIG. 10 depicts a hexagonal shaped primitive nanowire building block 163. Square shaped nanowire building block 163 is parameterized by a length, L, cross-sectional side lengths, S, an orientation angle in a plane parallel with the surface of the wafer substrate, and one or more material parameters.

Figure 11:
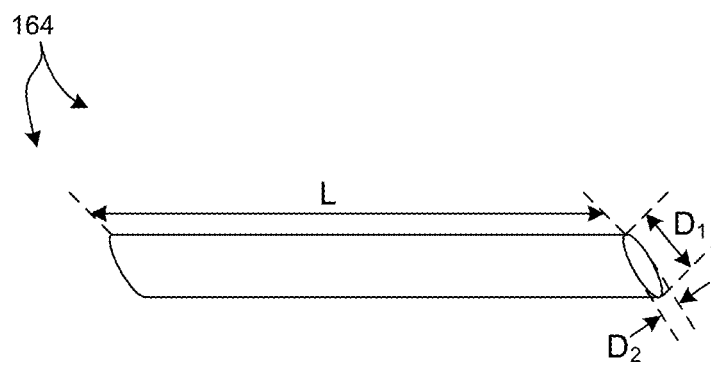
FIG. 11 is a diagram illustrative of an elliptically shaped primitive nanowire building block 164.

FIG. 11 depicts an elliptically shaped primitive nanowire building block 164. Elliptically shaped nanowire building block 164 is parameterized by shape parameters $D_1$ and $D_2$, i.e., twice the semi-major and semi-minor axes, respectively, length, L, an orientation angle in a plane parallel with the surface of the wafer substrate, and one or more material parameters.

Figure 12:
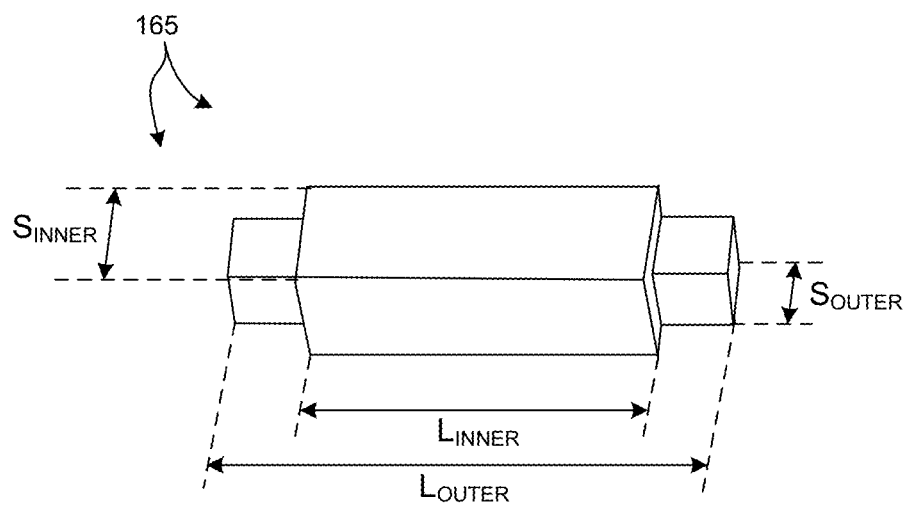
FIG. 12 is a diagram illustrative of a step shaped primitive nanowire building block 165 having two different cross-sections.

FIG. 12 depicts a step shaped primitive nanowire building block 165. Stepped shaped nanowire building block 165 has two different cross-sections. One cross-section defines a middle section of the stepped shaped block and another cross-section defines the end sections on both ends of the middle section. The middle section is parameterized by shape parameter, $S_{inner}$, and length, $L_{inner}$. The end sections are parameterized by a smaller shape parameter, $S_{outer}$, and length, $L_{outer}$. Stepped shaped block 165 abruptly transitions from the middle cross-section to the end cross-sections. Stepped shaped block 165 is also parameterized by an orientation angle in a plane parallel with the surface of the wafer substrate, and one or more material parameters.

Figure 13:
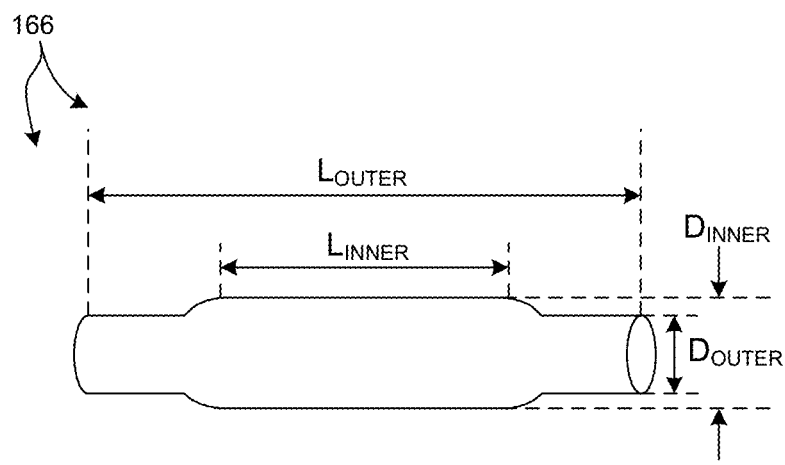
FIG. 13 is a diagram illustrative of an elongated primitive nanowire building block 166 having two different cross-sections.

FIG. 13 depicts an elongated primitive nanowire building block 166. Elongated nanowire building block 166 has two different cross-sections. One cross-section defines a middle section of the elongated shaped block and another cross-section defines the end sections on both ends of the middle section. The middle section is parameterized by a diameter, $D_{inner}$, and length, $L_{inner}$. The end sections are parameterized by a smaller diameter, $D_{outer}$, and length, $L_{outer}$. Elongated shaped block 166 smoothly tapers from the middle cross-section to the end cross-sections. Elongated shaped block 166 is also parameterized by an orientation angle in a plane parallel with the surface of the wafer substrate, and one or more material parameters.

In general, each nanowire block may be oriented such that the central axis of the nanowire, e.g., central axis, A, of cylindrical nanowire 160, is parallel to the surface of the wafer substrate (i.e., a lateral nanowire). This is analogous to the orientation of nanowires 151A-C depicted in FIG. 6. In some other examples, a nanowire may be oriented such that the central axis of the nanowire is perpendicular to the surface of the wafer substrate (i.e., a vertical nanowire).

The shape of the nanowire will affect the device performance significantly. Depending on the application, one nanowire shape could be desired over another shape. Therefore, the nanowire building blocks should be flexible and customizable to account for all expected shapes.

In general, a user interacts with a graphical user interface of a nanowire structural model building module (e.g., structural model building module 131 of model building and analysis engine 130 or structural model building module 351 of model building and analysis engine 350) to select a desired primitive nanowire building block and define the specific shape by entering the appropriate values of the independent parameters.

As depicted in FIGS. 7-13, a single re-useable, parametric sub-structure model that is fully defined by only a few independent parameters replaces a model that includes many geometric primitives and dozens of constraints and shape parameter values.

In contrast, a structural model of the nanowires depicted in FIGS. 7-13 would require the definition of many existing primitive building blocks (e.g., square frusta) and their interrelationships and constraints among each of the building blocks to model a similar nanowire structure. Thus, it is clear the difficulty associated with building a complex nanowire device structure using existing primitive building blocks.

In a nanowire semiconductor fabrication process, alternating layers of materials are deposited, for example, in the gate depicted in FIG. 6. In one example, alternating layers of silicon and silicon germanium are deposited. After the dummy gate material is removed, e.g., polysilicon, the nanowires are released. Nanowire release is a highly selective etch process where, for example, the silicon germanium layers are exclusively etched, leaving behind the silicon nanowires, e.g., nanowires 151A-C depicted in FIG. 6. After nanowire release, a series of ultra-thin materials are deposited on the gate prior to the deposition of the metal. These materials are typically very thin and are intended to wrap all around the nanowire. In one example, a 10 angstrom thick layer of silicon dioxide is deposited all around the nanowire. This silicon dioxide wrapper is itself wrapped by a high-K material wrapper. The high-K material wrapper is subsequently wrapped by a 10 angstrom thick titanium nitride wrapper, then a barrier metal tantalum nitride wrapper of 5-10 angstroms, then another titanium nitride wrapper, then a titanium aluminum carbide wrapper, and then a titanium nitride wrapper. The depositions are formed by atomic layer deposition (ALD). PMOS and NMOS require different high-k metal gate (HKMG) process flows, which can change the number of critical layers. The HKMG process is at the end of the front end of the line (FEOL) loop of the CMOS device. The number of wrappers around the gate as well as their thicknesses can vary depending on the technology node or the device type, e.g., N or P.

Figure 14:
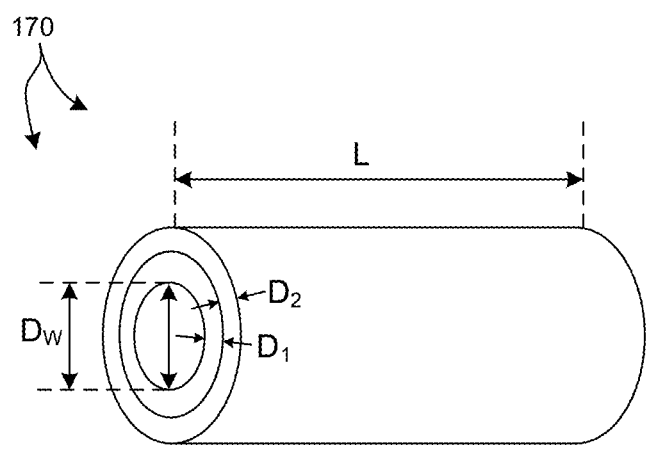
FIG. 14 is a diagram illustrative of a re-usable, parametric sub-structure model 170 representing two conformal layers wrapped around a nanowire.

In some embodiments, the re-useable, parametric substructure models are structure-specific. FIG. 14 depicts a re-usable, parametric sub-structure model 170 representing two conformal layers wrapped around a nanowire. As depicted in FIG. 14, the independent parameters that define the shape of the model are the thicknesses of each conformal layer, $D_1$ and $D_2$, the diameter of the nanowire, $D_w$, and the length of the wrapped nanowire structure, L. Optionally, material parameters associated each of the layers may be defined as independent variables that can be defined by a user.

A user of the model building tool only needs to enter the values of these parameters to fully define the geometry of this re-useable, parametric sub-structure model 170, representative of a wrapped nanowire. All of the other variables associated with the model shape and internal constraints are pre-defined within the model, and no further input is required to fully define the shape of model 170.

In general, the shape of the underlying nanowire defines the shape of the wrapper, e.g., cylindrical, rectangular, elliptical, etc. By default, when the user adds a wrapper to the nanowire the wrapper conforms to the nanowire shape. A wrapper definition includes a foundation building block, i.e., a building block upon which the wrapper conforms. The foundation building block associated with a wrapper is exclusively a nanowire or a prior wrapper.

In the embodiment depicted in FIG. 14, each wrapper is conformal with a uniform thickness all the way around and along the underlying foundation block (e.g., underlying nanowire or prior wrapper).

However, the high-K metal gate (HKMG) process is non-uniform. The all-around wrappers have different thicknesses depending on orientation. For example, the thickness of a given high-K wrapper layer is expected to be greater on the top side of the nanowire than the bottom side of the nanowire.

Figure 15A:
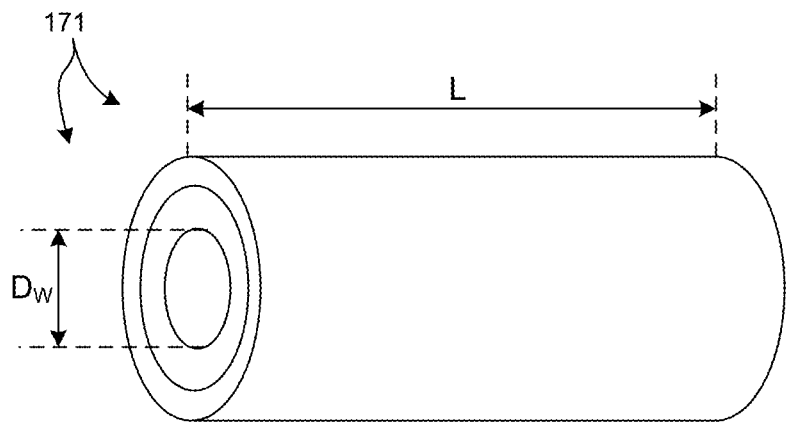
FIGS. 15A-B illustrate a perspective view and an end view, respectively, of a non-uniform thickness wrapper building block 171.
Figure 15B:
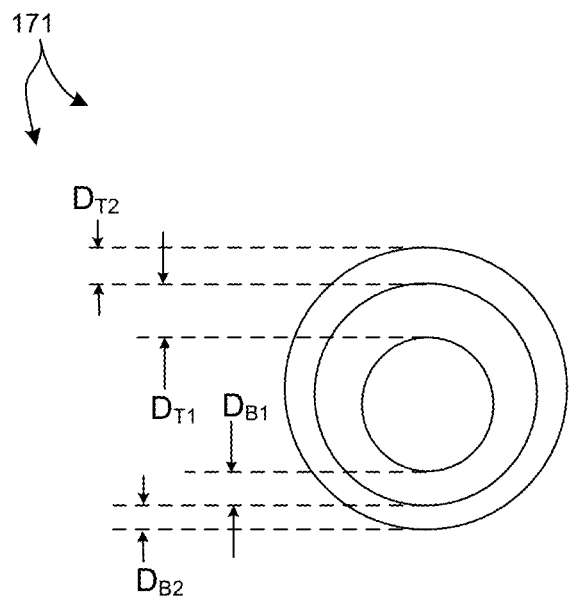

In a further aspect, a composite nanowire building block includes a non-uniform thickness wrapper. FIGS. 15A-B depict a perspective view and an end view, respectively, of a non-uniform thickness wrapper building block 171. As depicted in FIG. 15A, the geometry of non-uniform thickness wrapper building block 171 is parameterized by a cylindrical nanowire having a diameter, $D_w$, and a length, L. As depicted in FIG. 15B, the geometry of non-uniform thickness wrapper building block 171 is also parameterized by a wrapper around the cylindrical nanowire having a thickness, $D_{T1}$, above the nanowire and a thickness, $D_{B1}$, below the nanowire. Similarly, a wrapper around the first wrapper is parameterized by a thickness, $D_{T2}$, above the nanowire and a thickness, $D_{B2}$, below the nanowire. The differences in thickness above and below the nanowire are interpolated at orientations between the top and bottom of the nanowire.

Figure 16A:
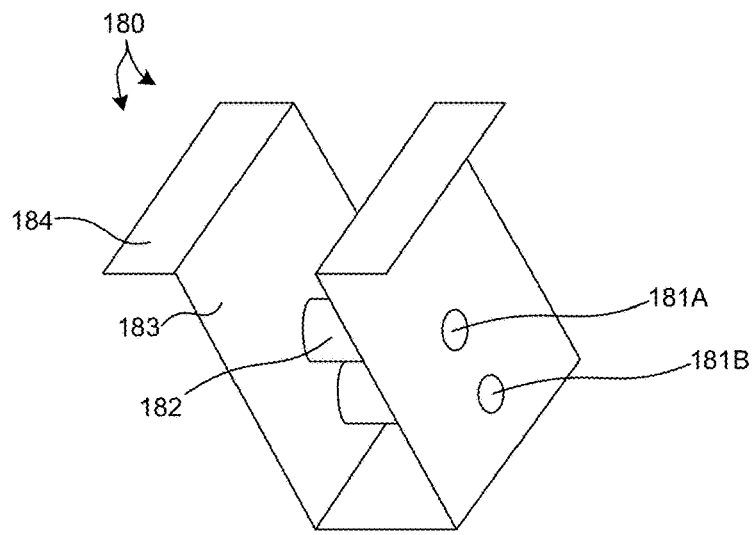
FIGS. 16A-C depict an isometric view, a face view, and a side view, respectively, of conformal liner-wrapper building block 180.
Figure 16B:
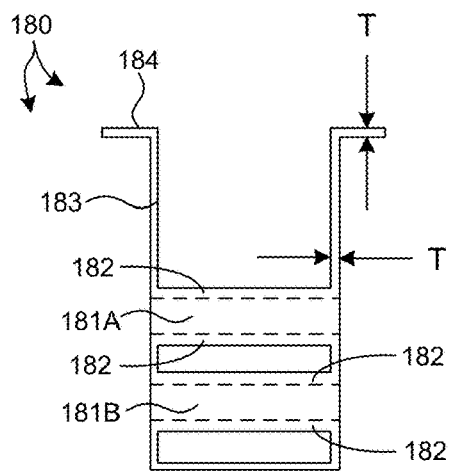
Figure 16C:
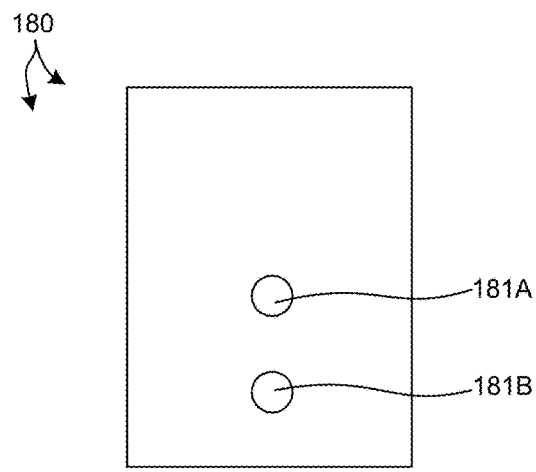

In another further aspect, a composite nanowire building block includes a uniform, conformal liner-wrapper. FIGS. 16A-C depict an isometric view, a face view, and a side view, respectively, of conformal liner-wrapper building block 180. The HKMG materials described hereinbefore are deposited across the wafer. Thus, the materials not only wrap around the nanowires, but also conform to the shape of the structure topography. The conformal liner-wrapper building block models the deposition of materials on all of the exposed structure (e.g., the deposition on the gate top surface 184, the deposition on the gate wall surfaces 183, and the wrapping 182 around nanowires 181A-B. FIG. 16B depicts the voids between the wrapped nanowires 181A-B. As depicted in FIG. 16B, the thickness, T, of the liner-wrapper material is uniform over all surfaces. Thus, the uniform, conformal liner-wrapper building block is defined by the thickness, T, and the material properties of the deposited material.

Figure 17A:
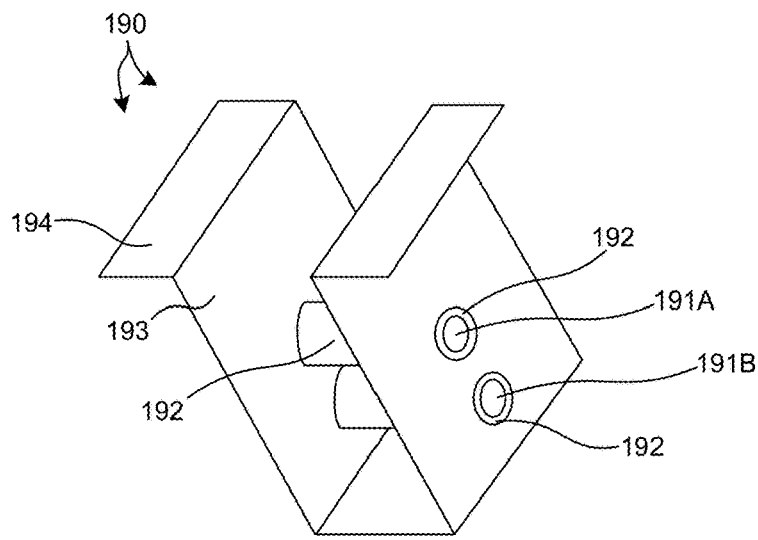
FIGS. 17A-C depict an isometric view, a face view, and a side view, respectively, of non-uniform, conformal liner-wrapper building block 190.
Figure 17B:
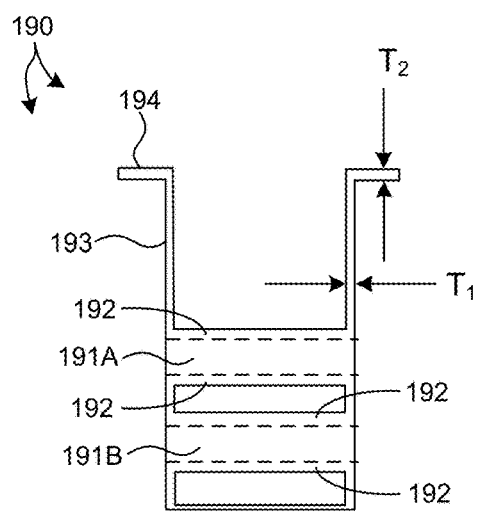
Figure 17C:
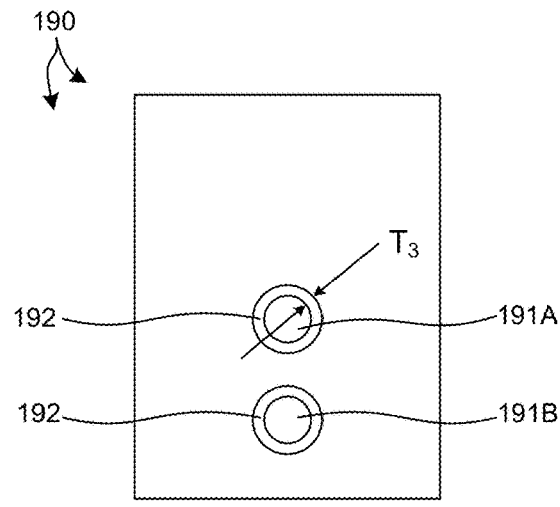

In another further aspect, a composite nanowire building block includes a non-uniform, conformal liner-wrapper. FIGS. 17A-C depict an isometric view, a face view, and a side view, respectively, of non-uniform, conformal liner-wrapper building block 190. The HKMG materials described hereinbefore are deposited across the wafer. Thus, the materials not only wrap around the nanowires, but also conform to the shape of the structure topography. However, they may not be deposited uniformly on all surfaces. The non-uniform conformal liner-wrapper building block models the non-uniform deposition of materials on all of the exposed structure (e.g., the deposition on the gate top surface 194, the deposition on the gate wall surfaces 193, and the wrapping 192 around nanowires 191A-B. FIG. 17B depicts the voids between the wrapped nanowires 191A-B. As depicted in FIG. 17B, the thickness, $T_2$, of the liner-wrapper material at the gate top surface 194 of the liner is different from the thickness, $T_1$, of the gate wall surfaces 193. As depicted in FIG. 17C, the thickness of the wrapper around the nanowires 191A-B is $T_3$. Thus, the non-uniform, conformal liner-wrapper building block 190 is defined by the top liner thickness, $T_2$, the gate wall liner thickness $T_1$, the wrapper thickness, $T_3$, and the material properties. In some embodiments, the bottom gate thickness of the non-uniform, conformal liner-wrapper building block 190 is also independently selected by a user.

In the embodiments depicted in FIGS. 16A-C and FIGS. 17A-C, each liner-wrapper is conformal all the way around and along the underlying foundation block (e.g., underlying nanowire or prior wrapper).

In some embodiments, a liner-wrapper is defined such that the liner-wrapper composite building block defines M wrappers around N wires and a single liner covering the gate walls, gate bottom, and gate top.

Figure 18A:
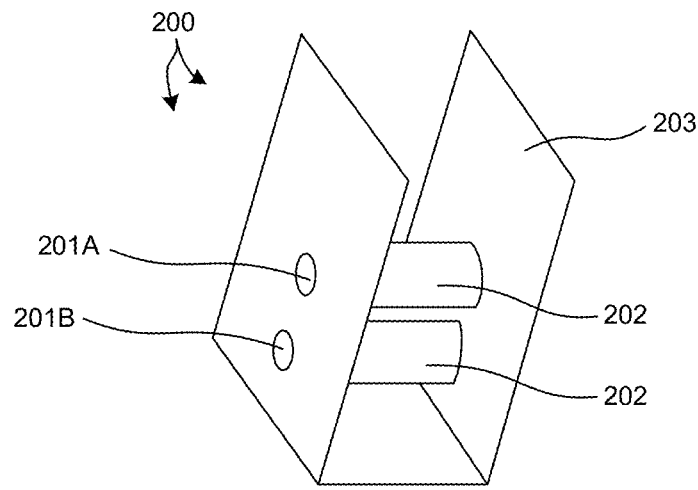
FIGS. 18A-C depict an isometric view, a face view, and a side view, respectively, of conformal spacer-wrapper building block 200.
Figure 18B:
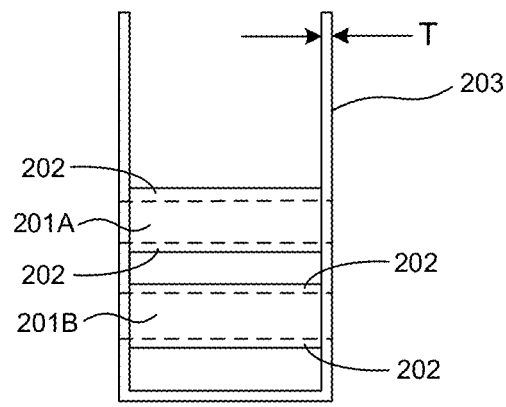
Figure 18C:
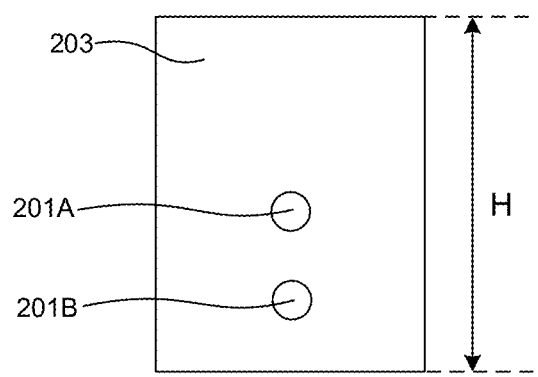

In another further aspect, a composite nanowire building block includes a conformal spacer-wrapper. FIGS. 18A-C depict an isometric view, a face view, and a side view, respectively, of conformal spacer-wrapper building block 200. The HKMG materials described hereinbefore are deposited across the wafer. After deposition, the heights of the materials are optimized. More specifically, the top of the liner is etched away and the shape becomes a combination of a spacer and a wrapper. The conformal spacer-wrapper building block models the etch of materials on all of the exposed structure (e.g., the etch on the gate wall surfaces 203 and the wrapping 202 around nanowires 201A-B. FIG. 18B depicts the voids between the wrapped nanowires 201A-B. FIG. 18B depicts the thickness, T, near the top of the liner. FIG. 18C depicts the height, H, of the spacer-wrapper after etch. Thus, the conformal spacer-wrapper building block 200 is defined by the liner thickness, T, the spacer height, H, and the material properties. In some embodiments, the spacer-wrapper thickness is non-uniform.

In some examples, any of the bottom gate thickness, the gate wall thickness, and the wrapper thickness are also independently selected by a user.

In the embodiments depicted in FIGS. 18A-C, each spacer-wrapper is conformal all the way around and along the underlying foundation block (e.g., underlying nanowire or prior wrapper).

In some embodiments, a spacer-wrapper is defined such that the spacer-wrapper composite building block defines M wrappers around N wires and a single spacer covering the gate walls and gate bottom.

In general, primitive building blocks are integrated and constrained together to model the composite building blocks such as the liner-wrappers 180 and 190 and the spacer-wrapper 200. The necessary constraints of each independent, composite building block are internally pre-defined and embedded into their design as part of the composite building block. The constraints are enforced at every use of the composite building block.

Figure 19A:
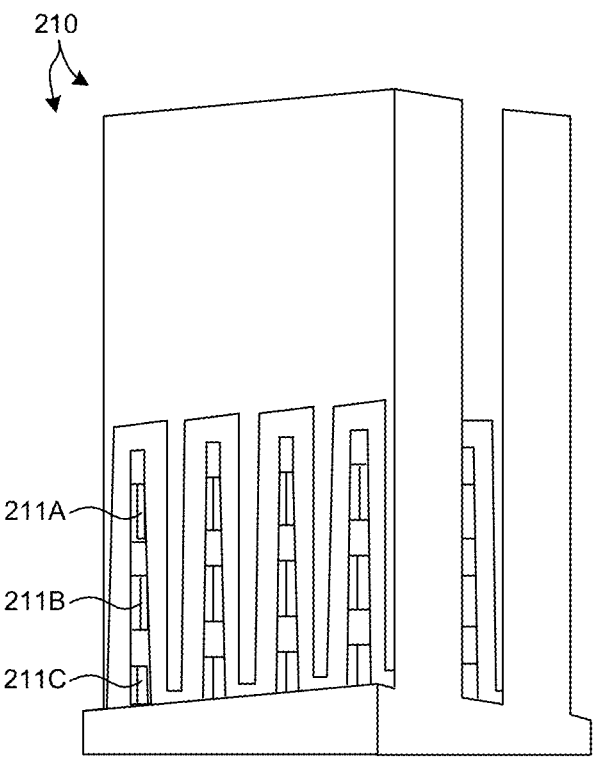
FIG. 19A depicts a nanowire structure 210 before an inner spacer process step.
Figure 19B:
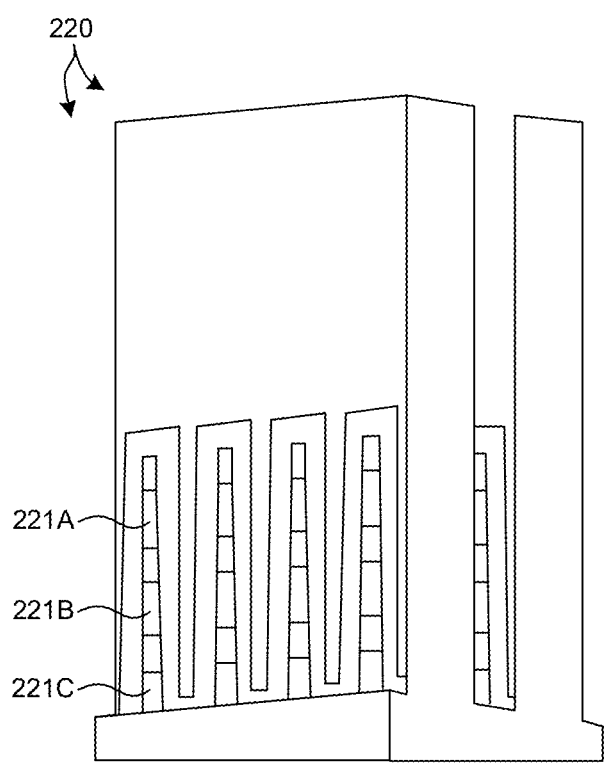
FIG. 19B depicts a nanowire structure 220 after the inner spacer process step.

The inner spacer is a technological process specific for nanowire based devices. The inner spacer is required to reduce parasitic capacitance between the nanowire channels and the source/drain structures in the extension regions. The inner spacer is a low-K material that fills the gap between two nanowires in the source/drain regions after Fin etch. FIG. 19A depicts a nanowire structure 210 before the inner spacer process step. As depicted in FIG. 19A, voids 211A-C exist between adjacent nanowires. FIG. 19B depicts nanowire structure 220 after the inner spacer process step. As depicted in FIG. 19B, voids 211A-C are filled with inner spacers 221A-C.

In another further aspect, a composite nanowire building block includes an inner spacer. The foundation block for the inner spacer building block is the nanowire building block. By default, when deposited on the nanowire, the inner spacer fills the air gap between every two adjacent nanowires and conforms to the air gap shape. In some examples, the inner spacer thickness, heights, and CD are auto-constrained. In some other examples, the auto-constraint equations are editable. In one example, the thickness of the inner spacer is editable, i.e., independently selectable by the user, to model use cases where the inner spacer underfills the air gap in the lateral direction, i.e., the direction parallel to the length axis of the nanowire.

Figure 20A:
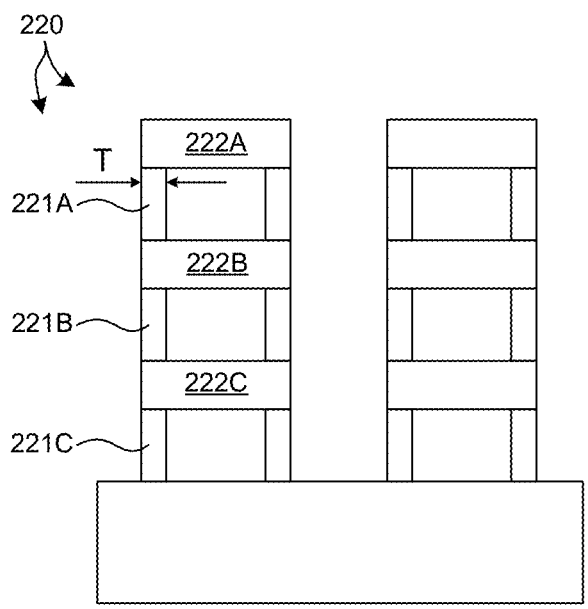
FIGS. 20A-C depict a face view, a side view, and an isometric view, respectively, of an array 220 of inner spacer building blocks along with corresponding nanowires.
Figure 20B:
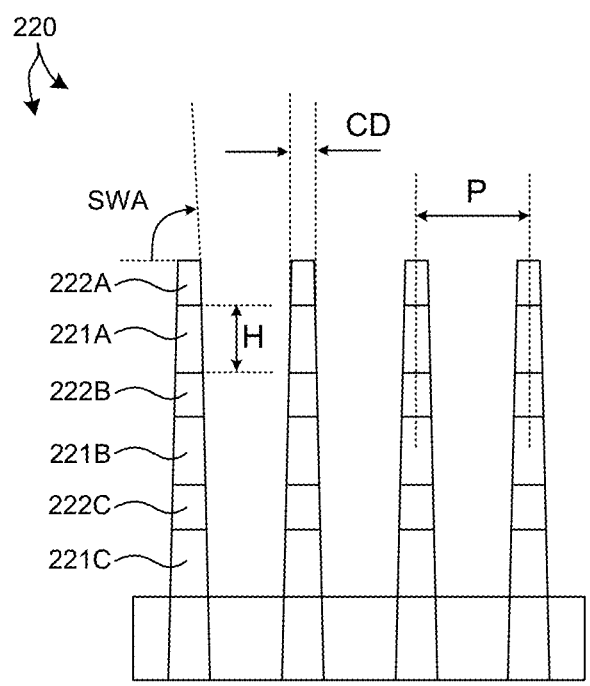
Figure 20C:
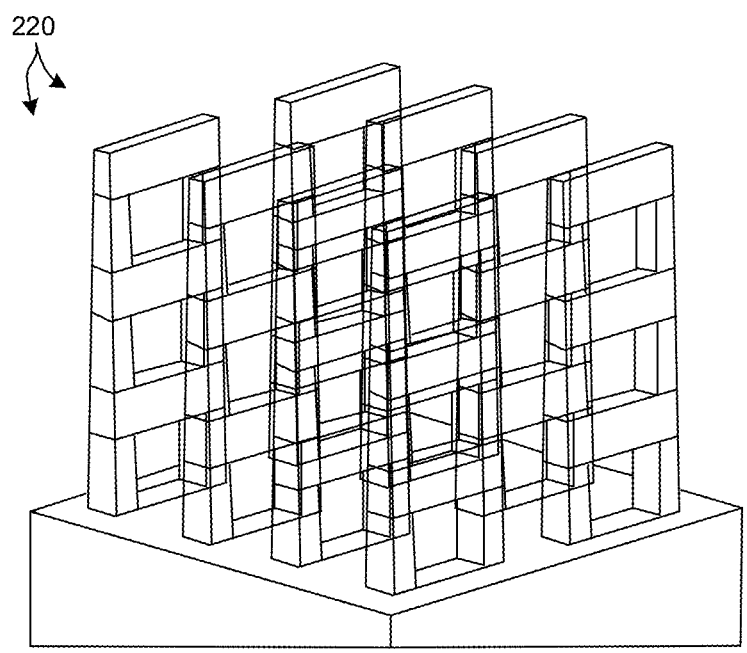

FIGS. 20A-C depict a face view, a side view, and an isometric view, respectively, of an array 220 of inner spacer building blocks along with corresponding nanowires. FIGS. 20A-C depict the inner spacers relative to the nanowires after the nanowire release process step. As depicted in FIGS. 20A-C, each inner spacer is positioned between two silicon nanowires. As depicted in FIGS. 20A-B, the geometry of each inner spacer is defined by six parameters: the thickness, T, in the lateral direction, the inner spacer CD, the inner spacer height, H, the pitch, P, separating two lateral inner spacers, the sidewall angle of the inner spacers, and the material parameters. By default, the thickness of the inner spacer is constrained to the air gap thickness, the inner spacer CD is constrained to the air gap CD, and the height, H, is the vertical space between two adjacent nanowires. The pitch is also the nanowire pitch. In some examples, the thickness and material properties of the inner spacer are the only independent parameters selected by the user, and the rest are auto-constrained, i.e., defined by the foundation block(s) upon which the inner spacer is built.

In the embodiments depicted in FIGS. 20A-C, each inner spacer is built on the underlying foundation block (e.g., underlying nanowire or prior wrapper).

Re-usable, parametric sub-structure models 170, 171, 180, 190, 200, 210, and 220 are examples of composite nanowire building blocks. A composite nanowire building block includes a combination of multiple primitive nanowire building blocks. In some examples, a composite nanowire building block includes multiple nanowires (e.g. N nanowires) spaced apart from one another by a user specified distance in one or more directions. For example, FIG. 20C depicts an inner spacer composite building block including a three dimensional array of nanowires and inner spacers.

In another further aspect, a model building tool integrates one or more re-useable, parametric models into a measurement model of a complex nanowire based semiconductor device. In some embodiments, a model building tool receives input from a user to combine geometric primitives with a re-useable, parametric sub-structure model to form a measurement model. In some other embodiments, a measurement model of a semiconductor device is fully described by one re-useable, parametric model. In some other embodiments, a measurement model of a semiconductor device is fully described by a combination of two or more re-useable, parametric models.

In another aspect, a model building tool generates a composite nanowire building block model based on input from a user.

In some embodiments, a model building tool generates a re-useable, parametric sub-structure model (e.g., a composite nanowire building block) based on a composition of a number of primitive nanowire building blocks, or simpler re-useable, parametric sub-structure models (e.g., composite nanowire building blocks) indicated by a user. The composition changes the collection of individual models into a single re-useable, parametric sub-structure model that can be used as an element of a measurement model as if it is a primitive building block. The model building tool saves the sub-structure model for later use. Internally, the sub-structure model includes the constraints necessary to fully integrate all of the underlying geometric primitives. These constraints are saved as part of the sub-structure model and are enforced at every instance of the sub-structure model. In this manner, users can create a collection of commonly used complex shapes with pre-defined constraints. The sub-structure model can be unloaded and saved into files, reloaded into a project and used, and shared among users.

The re-useable, parametric sub-structure models generated by the model building tool enable a user or group of users to generate a library of sub-structures that can be reused. Different users who use different instances of the same sub-structure model can expect to achieve the same numerical results.

Re-useable, parametric sub-structure models can be generated in different ways. In one example, a user directs the model building tool to combine and constrain one or more geometric primitives, one or more existing sub-structure models, or any combination by user-generated computer code. This results in a smoother model discretization that yields a more computationally efficient measurement model due to a reduced number of discretization points. In general, models that contain fewer geometric building blocks and fewer constraints result in a faster discretization as the discretization engine no longer needs to parse through so many geometric building blocks and constraints. In some embodiments, the discretization points of a first re-useable, parametric model are aligned with the discretization points of a second re-useable, parametric model within a floating point precision of the underlying computing system to ensure repeatable computational results from the combined model.

In some other examples, a user may interact with a graphical user interface (GUI) that allows a user to select one or more geometric primitives, one or more existing sub-structure models, or any combination, and then indicate the users desire to group these elements together and select the desired independent parameters. In response the model building tool automatically generates the appropriate constraints to realize a fully integrated parametric sub-structure model. The user can then export the newly created parametric sub-structure model into a file that can be used by others. In another example, the newly created parametric sub-structure model can be listed in the model building tool as an available building block that can be selected by a user to construct a measurement model, or yet another, more complex parametric sub-structure model. The re-usable parametric sub-structure models allow multiple users to collaboratively work on different parts of a complex model and assembly them together at the final stage.

The number of components required to assemble a complex device model is significantly reduced by combining two or more re-useable, parametric sub-structure models, rather than geometric primitives. Moreover, the numbers of relationships among the components that must be specified by the user are also significantly reduced. This simplifies the initial model building process, makes it less error-prone, and makes it easier to transfer models between different users.

In another further aspect, the model building tool generates and makes available for use, re-useable, parametric models of complex device sub-structures that include key characteristics of specific semiconductor processes embedded into their design. More specifically, a re-usable, parametric sub-structure model includes controls that allow the user to specify wafer artifacts created by one or more process steps.

In one embodiment, a re-useable, parametric model represents multiple process steps. Furthermore, the user is able to select which process step to model. For example, if a user wants to first model a trench etch process step, the user controls the re-useable, parametric model to include the processes needed to create the trench etch (i.e., the film deposition and trench etch steps). The user would define the material used in the film deposition step, define the thickness of the deposited film, and define the dimensions of the trench. If the user wants to model a planarization step, the user starts with the previously defined trench etch model and then controls the re-useable, parametric model to include the processes needed to create the planarized structure (i.e., the conformal deposition and planarization steps). The user would define the number of conformal depositions and the materials/thicknesses for each deposition define the depth of the planarization. In this manner, the user is able to individually control each of the process steps represented by the re-useable, parametric model. Thus, a single model can be utilized to measure multiple process steps.

In some lithography focus/dose applications, resist lines of stacked device structures are modeled as stacked trapezoids that are constrained in the following manner: 1) the top critical dimension (TCD) and bottom critical dimension (BCD) of adjacent trapezoids are constrained to be equal, 2) the heights of the individual trapezoids are constrained to be equal, 3) the individual critical dimensions are constrained to be functions of user-defined focus and dose parameters, and 4) the height of the individual trapezoids is constrained to be a function of the aforementioned focus and dose parameters. Traditionally, all of these constraints need to be set by the user.

In another further aspect, the model building tool generates and makes available for use, re-useable, parametric models of complex device sub-structures that include measurement application specific details (e.g., constraints, dimensions, etc. that derive from particular applications).

In some examples, the model building tool reads a file that contains the equations of the individual dimensions. This file is typically generated by a lithography simulator such as PROLITH software available from KLA-Tencor Corporation, Milpitas, Calif. (USA). Based on this application information the model building tool automatically sets the parameterization and constraints of the re-usable, parametric sub-structure model.

In another example, the model building tool can also be employed to generate re-usable, parametric sub-structure models that describe field enhancement elements used in some optical metrology applications. Field enhancement elements are described in further detail in U.S. Pat. No. 8,879,073 assigned to KLA-Tencor Corporation, the subject matter of which is incorporated herein by reference its entirety. The model building tool can be employed to generated re-usable, parametric sub-structure models for each type of field enhancement element and different applications.

In yet another example, a model building tool is also employed to generate re-usable, parametric sub-structure models that describe metrology targets generated by metrology target design or overlay design software. In one example, the model building tool receives graphical database system (GDS) data generated by a software simulator and automatically generates re-usable, parametric sub-structure models that predicts the morphology of spacer pitch splitting.

In yet another aspect, the model building tool includes security features to control the sharing of sensitive intellectual property with particular users. For example, it may be desirable for an entity to share a measurement model with another entity, but without sharing particular aspects of the measurement model that include sensitive intellectual property. In some examples, the model building tool allows a user to hide all or part of one or more re-useable, parametric sub-structure models from display to allow the models to be shared with other entities. In some examples, the model building tool allows a user to omit all or part of one or more re-useable, parametric sub-structure models to prevent sharing of these sensitive elements with another entity. In some other examples, the model building tool allows a user to include password protection to control access to all or part of one or more re-useable, parametric sub-structure models to limit the sharing of sensitive elements to authorized entities. In this manner, sensitive intellectual property embodied in certain features of the re-useable, parametric sub-structure models can be kept private by the user.

Although the methods discussed herein are explained with reference to systems 100 and 300, any optical or x-ray metrology system configured to illuminate and detect light reflected, transmitted, or diffracted from a specimen may be employed to implement the exemplary methods described herein. Exemplary systems include an angle-resolved reflectometer, a scatterometer, a reflectometer, an ellipsometer, a spectroscopic reflectometer or ellipsometer, a beam profile reflectometer, a multi-wavelength, two-dimensional beam profile reflectometer, a multi-wavelength, two-dimensional beam profile ellipsometer, a rotating compensator spectroscopic ellipsometer, a transmissive x-ray scatterometer, a reflective x-ray scatterometer, etc. By way of non-limiting example, an ellipsometer may include a single rotating compensator, multiple rotating compensators, a rotating polarizer, a rotating analyzer, a modulating element, multiple modulating elements, or no modulating element.

It is noted that the output from a source and/or target measurement system may be configured in such a way that the measurement system uses more than one technology. In fact, an application may be configured to employ any combination of available metrology sub-systems within a single tool, or across a number of different tools.

A system implementing the methods described herein may also be configured in a number of different ways. For example, a wide range of wavelengths (including visible, ultraviolet, infrared, and X-ray), angles of incidence, states of polarization, and states of coherence may be contemplated. In another example, the system may include any of a number of different light sources (e.g., a directly coupled light source, a laser-sustained plasma light source, etc.). In another example, the system may include elements to condition light directed to or collected from the specimen (e.g., apodizers, filters, etc.).

In general, the optical dispersion properties of nanowire based semiconductor structures under measurement may be approximated as isotropic. Under this assumption the material parameters provided as input to the nanowire based building blocks are scalar values. Alternatively, the optical dispersion properties of nanowire based semiconductor structures under measurement may be more accurately modelled as anisotropic. Under this assumption, the material parameters provided as input to the nanowire based building blocks will be a matrix of different values, rather than a scalar value. Additional details regarding the treatment of anisotropic structures under measurement is described in U.S. Patent Publication No. 2018/0059019, the content of which is incorporated herein by reference in its entirety.

Figure 21:
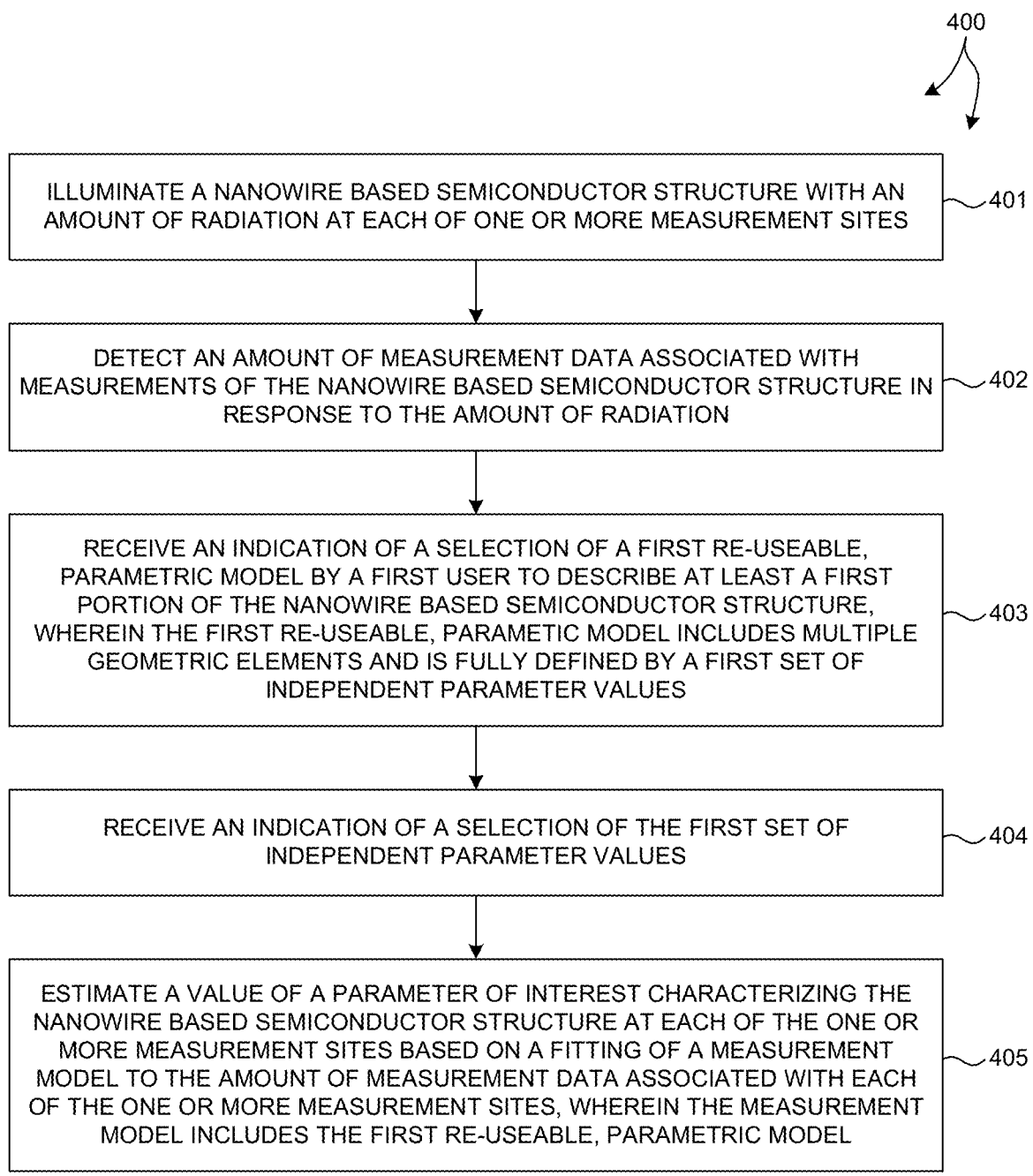
FIG. 21 illustrates a method 400 for measuring nanowire based semiconductor structures based on measurement models generated with re-useable, parametric geometric building blocks as described herein.

FIG. 21 illustrates a method 400 suitable for implementation by the metrology systems 100, 300, and 500 of the present invention. In one aspect, it is recognized that data processing blocks of method 400 may be carried out via a pre-programmed algorithm executed by one or more processors of computing systems 130, 330, or 530. While the following description is presented in the context of metrology systems 100, 300, and 500, it is recognized herein that the particular structural aspects of metrology systems 100, 300, and 500 do not represent limitations and should be interpreted as illustrative only.

In block 401, a nanowire based semiconductor structure is illuminated with an amount of radiation at each of one or more measurement sites.

In block 402, an amount of measurement data associated with measurements of the nanowire based semiconductor structure is detected in response to the amount of illuminating radiation.

In block 403, an indication of a selection of a first re-useable, parametric model by a first user to describe at least a first portion of the nanowire based semiconductor structure is received. The first re-useable, parametic model includes multiple geometric elements and is fully defined by a first set of independent parameter values.

In block 404, an indication of a selection of the first set of independent parameter values is received.

In block 405, a value of a parameter of interest characterizing the nanowire based semiconductor structure at each of the one or more measurement sites is estimated based on a fitting of a measurement model to the amount of measurement data associated with each of the one or more measurement sites. The measurement model includes the first re-useable, parametric model.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), a displacement between two or more structures (e.g., overlay displacement between overlaying grating structures, etc.), and a dispersion property value of a material used in the structure or part of the structure. Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a site, or sites, on a wafer, a reticle, or any other sample that may be processed (e.g., printed or inspected for defects) by means known in the art. In some examples, the specimen includes a single site having one or more measurement targets whose simultaneous, combined measurement is treated as a single specimen measurement or reference measurement. In some other examples, the specimen is an aggregation of sites where the measurement data associated with the aggregated measurement site is a statistical aggregation of data associated with each of the multiple sites. Moreover, each of these multiple sites may include one or more measurement targets associated with a specimen or reference measurement.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
an illumination subsystem configured to illuminate a nanowire based semiconductor structure with an amount of radiation at each of one or more measurement sites;
a detector configured to detect an amount of measurement data associated with measurements of the nanowire based semiconductor structure in response to the amount of radiation; and
a computing system configured to:
receive an indication of a selection of a first re-useable, parametric model by a first user to describe at least a first portion of the nanowire based semiconductor structure, wherein the nanowire based semiconductor structure is a semiconductor channel, and wherein the nanowire based semiconductor structure extends unsupported between a semiconductor source structure and a semiconductor drain structure, and wherein the first re-useable, parametric model includes multiple geometric elements and is fully defined by a first set of independent parameter values;
receive an indication of a selection of the first set of independent parameter values; and
estimate a value of a parameter of interest characterizing the nanowire based semiconductor structure at each of the one or more measurement sites based on a fitting of a measurement model to the amount of measurement data associated with each of the one or more measurement sites, wherein the measurement model includes the first re-useable, parametric model.

2. The metrology system of claim 1, wherein the nanowire based semiconductor structure comprises at least a portion of an actual semiconductor device.

3. The metrology system of claim 1, wherein the measurement model of the nanowire based semiconductor structure is fully described by the first re-useable, parametric model.

4. The metrology system of claim 1, the computing system further configured to:
receive an indication of a selection of a second re-usable, parametric model by the first user to describe at least a second portion of the nanowire based semiconductor structure, wherein the second re-useable, parametric model includes multiple geometric elements and is fully defined by a second set of independent parameter values;
receive an indication of a selection of the second set of independent parameter values;
determine the measurement model of the nanowire based semiconductor structure based at least in part on a combination of the first and second re-useable, parametric models; and
storing the measurement model in a memory.

5. The metrology system of claim 4, wherein a plurality of discretization points of the first re-useable, parametric model are aligned with a plurality of discretization points of the second re-useable, parametric model within a floating point precision of the computing system.

6. The metrology system of claim 1, wherein the selection of the first set of independent parameter values that define the first re-useable, parametric model is made by the first user.

7. The metrology system of claim 1, the computing system further configured to:
receive an output file generated by a process simulation tool; and
determine the first set of independent parameter values from the output file.

8. The metrology system of claim 1, wherein the first re-useable, parametric model includes a parametric geometric model of a lateral nanowire or a vertical nanowire.

9. The metrology system of claim 8, wherein the parametric geometric model describes the lateral nanowire or the vertical nanowire having any of a cylindrical cross-section, a rectangular cross-section, a rectangular cross-section with radiused corners, an elliptical cross-section, a hexagonal cross-section, a stepped cross-section, and a tapered cross-section.

10. The metrology system of claim 1, wherein the first re-useable, parametric model is a composite nanowire building block including multiple primitive geometric elements integrated into a single parametric geometric model.

11. The metrology system of claim 10, wherein the composite nanowire building block includes any of a uniform, conformal wrapper model, a non-uniform, conformal wrapper model, a uniform, conformal liner-wrapper model, a non-uniform, conformal liner-wrapper model, a conformal spacer-wrapper model, and an inner spacer model.

12. The metrology system of claim 10, wherein the composite nanowire building block includes a model of an array of nanowires, wrappers, liner-wrappers, spacer-wrappers, inner spacers, or any combination thereof.

13. The metrology system of claim 1, wherein the illumination subsystem and the detector comprise an optical metrology system or an x-ray based metrology system.

14. The metrology system of claim 1, wherein the first re-useable, parametric model of at least a first portion of the nanowire based semiconductor structure includes geometric features and interrelationships among geometric features that are specific to a particular measurement application.

15. A metrology system comprising:
an illumination subsystem configured to illuminate a nanowire based semiconductor structure with an amount of radiation at each of one or more measurement sites;
a detector configured to detect an amount of measurement data associated with measurements of the nanowire based semiconductor structure in response to the amount of radiation; and
a computing system configured to:
receive an indication of a selection by a user of a plurality of primitive geometric modeling elements;
receive an indication from the user indicating a desired position of each of the plurality of primitive geometric modeling elements with respect to the other primitive geometric modeling elements;
receive an indication from the user indicating a desired parameterization of the plurality of primitive geometric modeling elements;
determine a first re-usable, parametric model of at least a portion of the nanowire based semiconductor structure based on a combination of the plurality of primitive geometric elements, wherein the nanowire based semiconductor structure is a semiconductor channel, and wherein the nanowire based semiconductor structure extends unsupported between a semiconductor source structure and a semiconductor drain structure, and wherein the first re-useable, parametric model is fully defined by a set of independent parameters associated with the desired parameterization; and
store the first re-useable, parametric model in a memory.

16. The metrology system of claim 15, wherein the determining of the first re-usable, parametric model involves generating a set of constraint relationships that fully integrate the plurality of primitive geometric modeling elements into the re-useable, parametric model that is fully defined by the set of independent parameters.

17. The metrology system of claim 15, the computing system further configured to:
receive an indication of a selection by the user of the first re-useable, parametric model;
receive an indication of a selection by the user of a second re-usable, parametric model, wherein the second re-useable, parametric model includes multiple geometric elements and is fully defined by a second set of independent parameter values;
determine a measurement model of the nanowire based semiconductor structure based at least in part on a combination of the first and second re-useable, parametric models; and
store the first measurement model in a memory.

18. A method comprising:
illuminating a nanowire based semiconductor structure with an amount of radiation at each of one or more measurement sites;
detecting an amount of measurement data associated with measurements of the nanowire based semiconductor structure in response to the amount of radiation;
receiving an indication of a selection of a first re-useable, parametric model by a first user to describe at least a first portion of the nanowire based semiconductor structure, wherein the nanowire based semiconductor structure is a semiconductor channel, and wherein the nanowire based semiconductor structure extends unsupported between a semiconductor source structure and a semiconductor drain structure, and wherein the first re-useable, parametric model includes multiple geometric elements and is fully defined by a first set of independent parameter values;
receiving an indication of a selection of the first set of independent parameter values; and
estimating a value of a parameter of interest characterizing the nanowire based semiconductor structure at each of the one or more measurement sites based on a fitting of a measurement model to the amount of measurement data associated with each of the one or more measurement sites, wherein the measurement model includes the first re-useable, parametric model.

19. The method of claim 18, wherein the first re-useable, parametric model includes a parametric geometric model of a lateral nanowire or a vertical nanowire.

20. The method of claim 19, wherein the parametric geometric model describes the lateral nanowire or the vertical nanowire having any of a cylindrical cross-section, a rectangular cross-section, a rectangular cross-section with radiused corners, an elliptical cross-section, a hexagonal cross-section, a stepped cross-section, and a tapered cross-section.

* * * * *